United States Patent
Choi et al.

(10) Patent No.: US 11,336,249 B2
(45) Date of Patent: May 17, 2022

(54) MULTILAYER FILTER INCLUDING A CAPACITOR CONNECTED WITH AT LEAST TWO VIAS

(71) Applicant: AVX Corporation, Fountain Inn, SC (US)

(72) Inventors: Kwang Choi, Simpsonville, SC (US); Marianne Berolini, Greenville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 0 days.

(21) Appl. No.: 16/720,038

(22) Filed: Dec. 19, 2019

(65) Prior Publication Data

US 2020/0204138 A1 Jun. 25, 2020

Related U.S. Application Data

(60) Provisional application No. 62/782,488, filed on Dec. 20, 2018.

(51) Int. Cl.
 *H03H 1/00* (2006.01)
 *H03H 3/00* (2006.01)

(52) U.S. Cl.
 CPC ............. *H03H 1/00* (2013.01); *H03H 3/00* (2013.01); *H03H 2001/0014* (2013.01); *H03H 2001/0085* (2013.01)

(58) Field of Classification Search
 CPC .... H03H 1/00; H03H 3/00; H03H 2001/0014; H03H 2001/0085
 See application file for complete search history.

(56) References Cited

U.S. PATENT DOCUMENTS 5,357,227 A 10/1994 Tonegawa et al.
6,529,101 B2 3/2003 Tojyo et al.
(Continued)

FOREIGN PATENT DOCUMENTS

CN 1855613 A 11/2006
CN 102354777 A 2/2012
(Continued)

OTHER PUBLICATIONS

Dissertation of Seunghyun Eddy Hwang to Georgia Institute of Technology entitled "Characterization and Design of Embedded Passive Circuits for Applications Up to Millimeter-Wave Frequency," dated Aug. 2011, 196 pages.

(Continued)

*Primary Examiner* — Dinh T Le
(74) *Attorney, Agent, or Firm* — Dority & Manning, P.A.

(57) ABSTRACT

A multilayer filter may include a plurality of dielectric layers stacked in a Z-direction. A first conductive layer may overlie one of the dielectric layers, and a second conductive layer may overlie another of the dielectric layers and be spaced apart from the first conductive layer in the Z-direction. A first via may be connected with the second conductive layer at a first location. A second via may be connected with the second conductive layer at a second location that is spaced apart in a first direction from the first location. The first conductive layer may overlap the second conductive layer at an overlapping area to form a capacitor. At least a portion of the overlapping area may be located between the first location and the second location in the first direction. The second conductive layer may be free of via connections that intersect the overlapping area.

25 Claims, 30 Drawing Sheets

(56) References Cited

U.S. PATENT DOCUMENTS

| | | | |
|---|---|---|---|
| 6,556,416 | B2 | 4/2003 | Kunihiro |
| 6,720,848 | B2 | 4/2004 | Okamura et al. |
| 6,734,755 | B2 | 5/2004 | Cites et al. |
| 6,771,148 | B2 | 8/2004 | Okamura et al. |
| 6,791,435 | B2 | 9/2004 | Shingaki et al. |
| 6,900,708 | B2 | 5/2005 | White et al. |
| 6,970,708 | B1 | 5/2005 | White et al. |
| 6,958,667 | B2 | 10/2005 | Mizoguchi et al. |
| 6,970,057 | B2 | 11/2005 | Lin et al. |
| 7,068,124 | B2 | 6/2006 | White et al. |
| 7,098,760 | B2 | 8/2006 | Okamura et al. |
| 7,119,639 | B2 | 10/2006 | Okamura et al. |
| 7,126,444 | B2 | 10/2006 | Fukunaga et al. |
| 7,187,109 | B2 | 3/2007 | Tikka et al. |
| 7,239,219 | B2 | 7/2007 | Brown et al. |
| 7,239,221 | B2 | 7/2007 | Okamura et al. |
| 7,245,194 | B2 | 7/2007 | Muto |
| 7,268,648 | B2 | 9/2007 | Okamura et al. |
| 7,312,676 | B2 | 12/2007 | Kundu |
| 7,592,885 | B2 | 9/2009 | Sekine et al. |
| 7,612,634 | B2 | 11/2009 | Iwata |
| 7,652,554 | B2 * | 1/2010 | Moriai ................ H03H 7/1758 338/61 |
| 7,907,034 | B2 | 3/2011 | Taniguchi |
| 8,013,688 | B2 | 9/2011 | White et al. |
| 8,067,723 | B2 | 11/2011 | Yamada et al. |
| 8,106,722 | B2 | 1/2012 | Shimamura et al. |
| 8,159,313 | B2 | 4/2012 | Uchaykin |
| 8,179,210 | B2 | 5/2012 | Feichtinger |
| 8,384,013 | B2 | 2/2013 | Yamada et al. |
| 8,390,984 | B2 | 3/2013 | Liu et al. |
| 8,405,468 | B2 | 3/2013 | Uchaykin |
| 8,446,705 | B2 | 5/2013 | Ritter et al. |
| 8,451,073 | B2 | 5/2013 | Hoeft et al. |
| 8,659,871 | B2 | 2/2014 | Togashi et al. |
| 8,754,726 | B2 | 6/2014 | Sasaki et al. |
| 9,142,342 | B2 | 9/2015 | Haner |
| 9,218,910 | B2 | 12/2015 | Kim |
| 9,240,392 | B2 | 1/2016 | Hurwitz et al. |
| 9,287,845 | B2 | 3/2016 | Fukamachi et al. |
| 9,349,788 | B2 | 5/2016 | Hurwitz et al. |
| 9,647,313 | B2 | 5/2017 | Marconi et al. |
| 9,698,747 | B2 | 7/2017 | Ishizuka |
| 9,935,603 | B2 | 4/2018 | Imamura |
| 9,949,373 | B2 | 4/2018 | Hurwitz et al. |
| 10,014,843 | B2 | 7/2018 | Hurwitz et al. |
| 10,063,211 | B2 | 8/2018 | Yahezkely et al. |
| 10,110,196 | B2 | 10/2018 | Mukai |
| 10,218,330 | B2 | 2/2019 | Park et al. |
| 10,236,854 | B2 | 3/2019 | Hurwitz et al. |
| 10,277,190 | B2 | 4/2019 | Masuda et al. |
| 10,283,566 | B2 * | 5/2019 | Sei ...................... H01L 27/1157 |
| 10,389,329 | B2 | 8/2019 | Shiokawa |
| 10,466,335 | B2 | 10/2019 | Hurwitz et al. |
| 10,763,214 | B2 | 9/2020 | Kariyazaki et al. |
| 10,944,375 | B2 | 3/2021 | Imamura |
| 11,114,993 | B2 | 9/2021 | Choi et al. |
| 2006/0055489 | A1 | 3/2006 | Okamura et al. |
| 2007/0085108 | A1 | 4/2007 | White et al. |
| 2008/0047743 | A1 | 2/2008 | Komatsu et al. |
| 2009/0027141 | A1 | 1/2009 | Oshima |
| 2009/0033439 | A1 | 2/2009 | Igarashi |
| 2014/0153154 | A1 | 6/2014 | Choi et al. |
| 2015/0296617 | A1 | 10/2015 | Hurwitz et al. |
| 2016/0307702 | A1 | 10/2016 | Tanaka et al. |
| 2017/0133997 | A1 | 5/2017 | Imamura |
| 2020/0203075 | A1 * | 6/2020 | Choi ...................... H01G 4/005 |
| 2020/0204137 | A1 | 6/2020 | Choi et al. |
| 2020/0204142 | A1 | 6/2020 | Choi et al. |
| 2020/0205285 | A1 | 6/2020 | Choi et al. |

FOREIGN PATENT DOCUMENTS

| | | |
|---|---|---|
| EP | 2 068 393 A1 | 6/2009 |
| JP | 2008004768 A | 1/2008 |
| JP | 2008017243 A | 1/2008 |
| JP | 4539422 B2 | 9/2010 |
| JP | 5152192 B2 | 2/2013 |
| JP | 2018067612 A | 4/2018 |
| KR | 20170004238 A | 1/2017 |
| TW | 548669 B | 8/2003 |
| WO | WO 2004/004061 | 1/2004 |

OTHER PUBLICATIONS

International Search Repott and Written Opinion for PCT/US2019/067361 dated Apr. 21, 2020, 12 pages.

Xuedong Wang, "Multilayer Ceramic Bandpass Filter With Coupling Capacitor," *Chinese Journal of Radio Science*, vol. 18, Issue 5, Oct. 31, 2003.

Chinese Search Report for CN Application No. 2019800845649 dated Oct. 28, 2021, 2 paes.

* cited by examiner

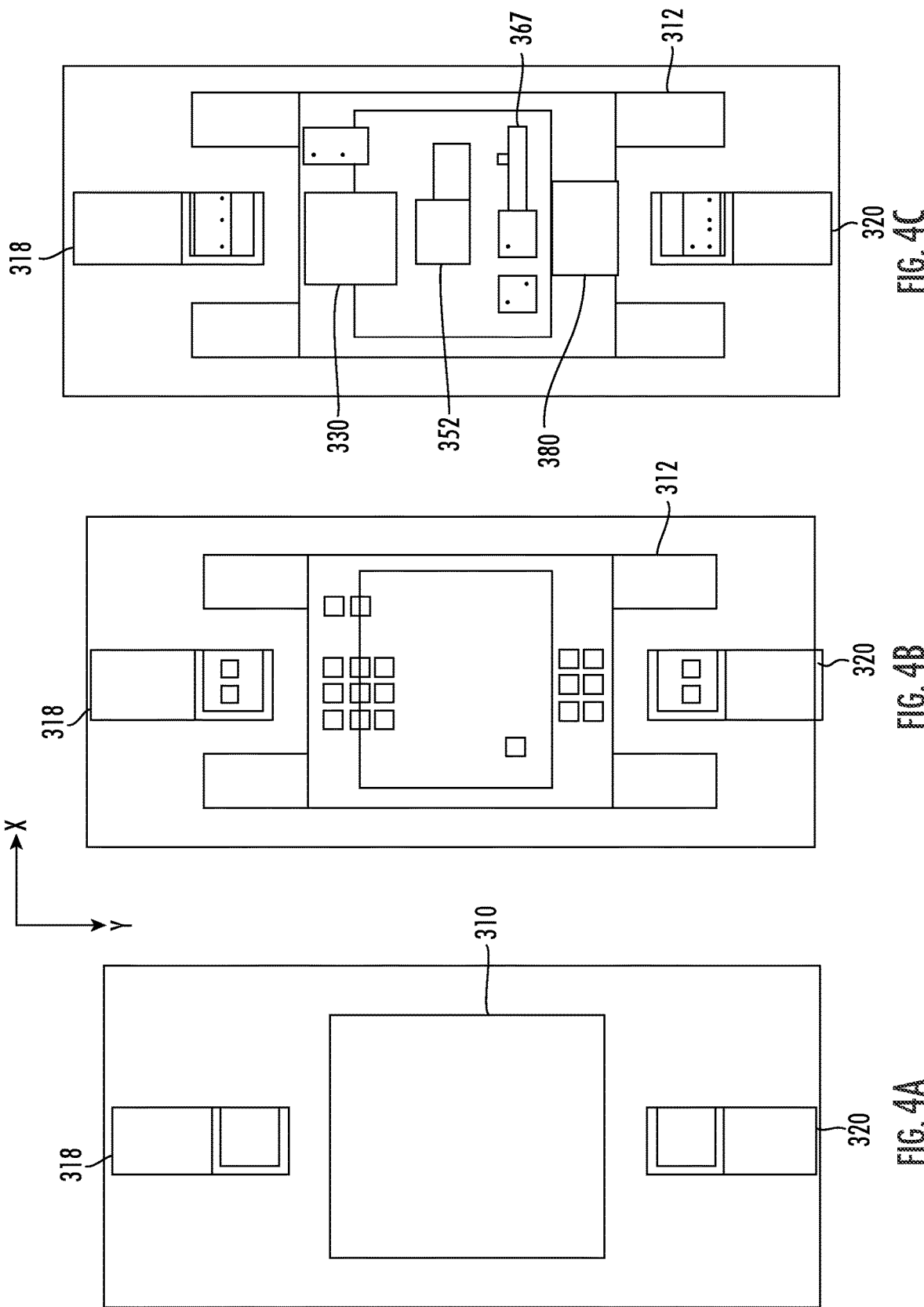

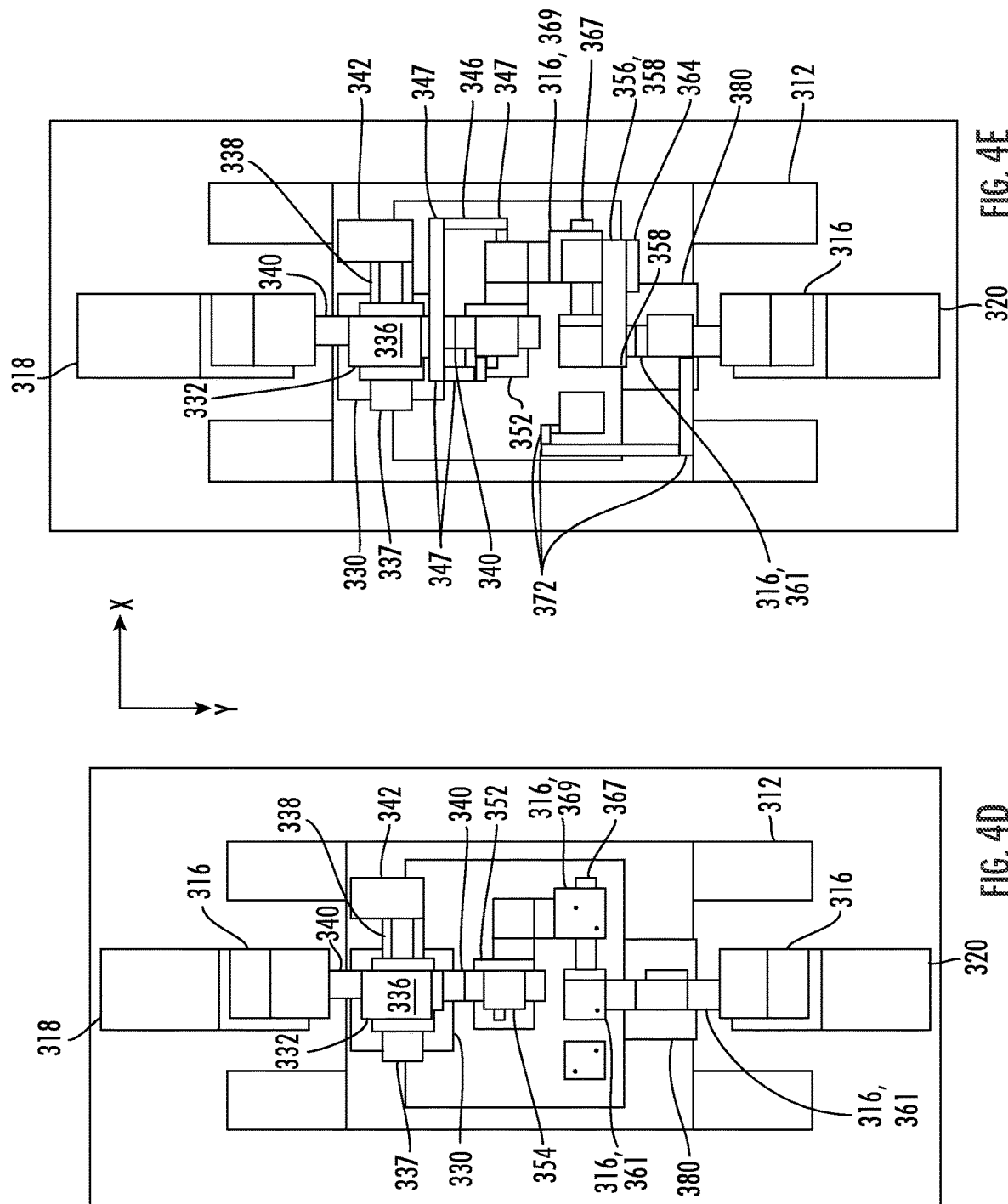

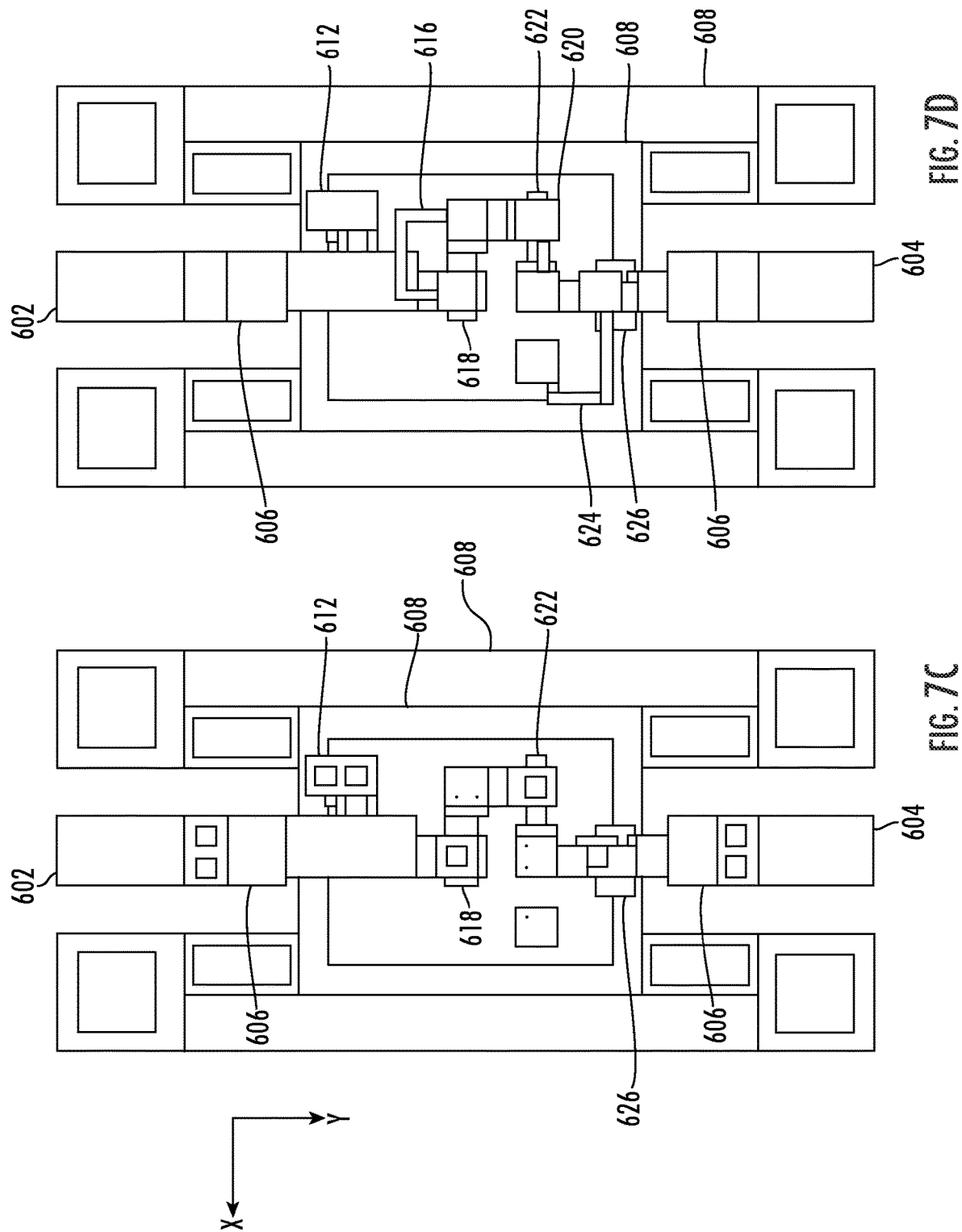

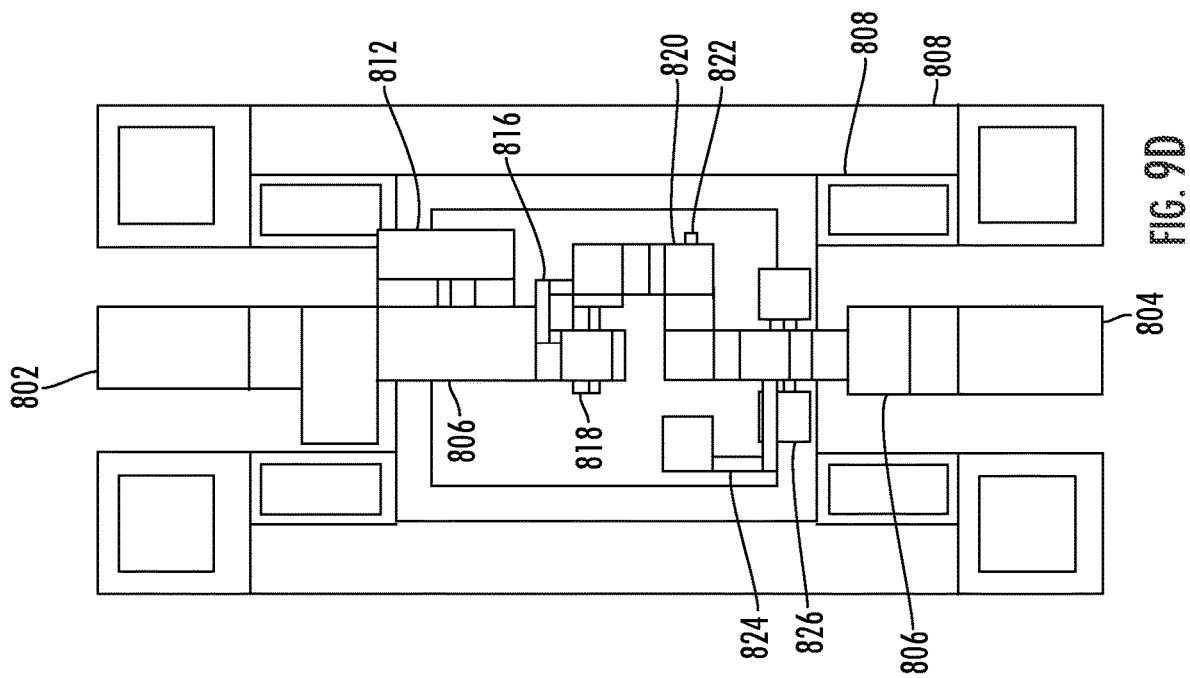
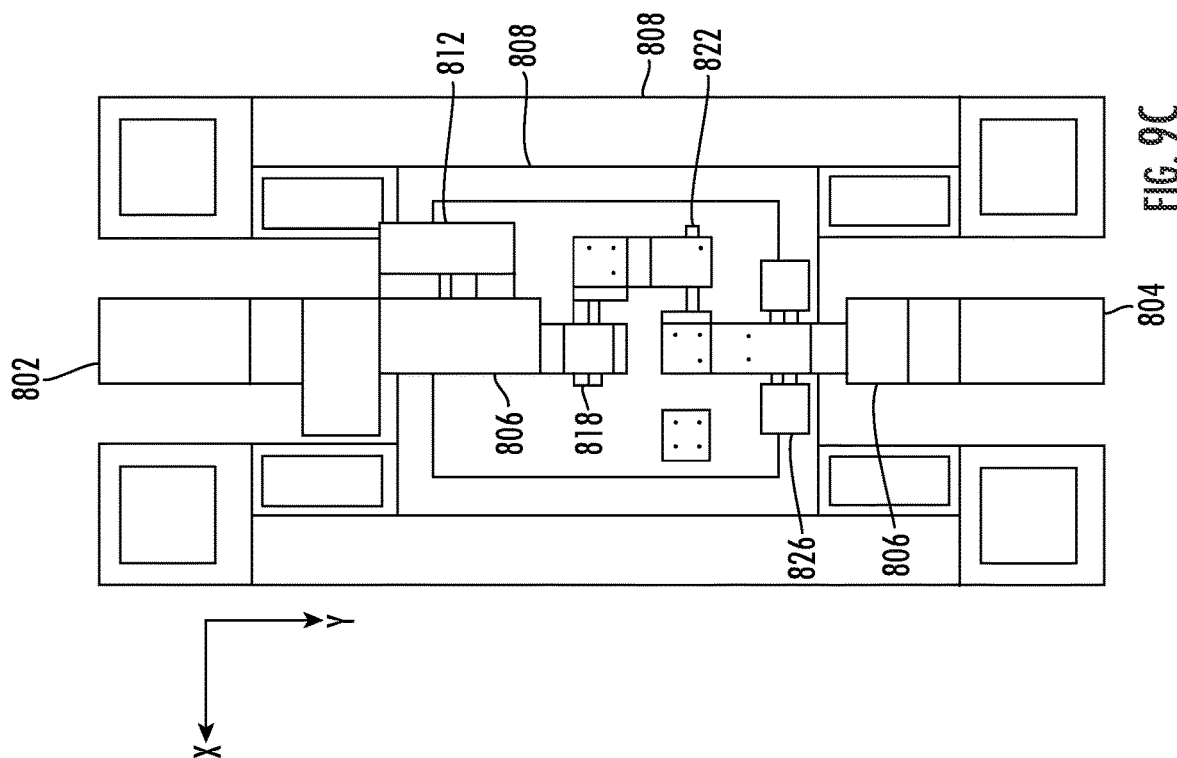

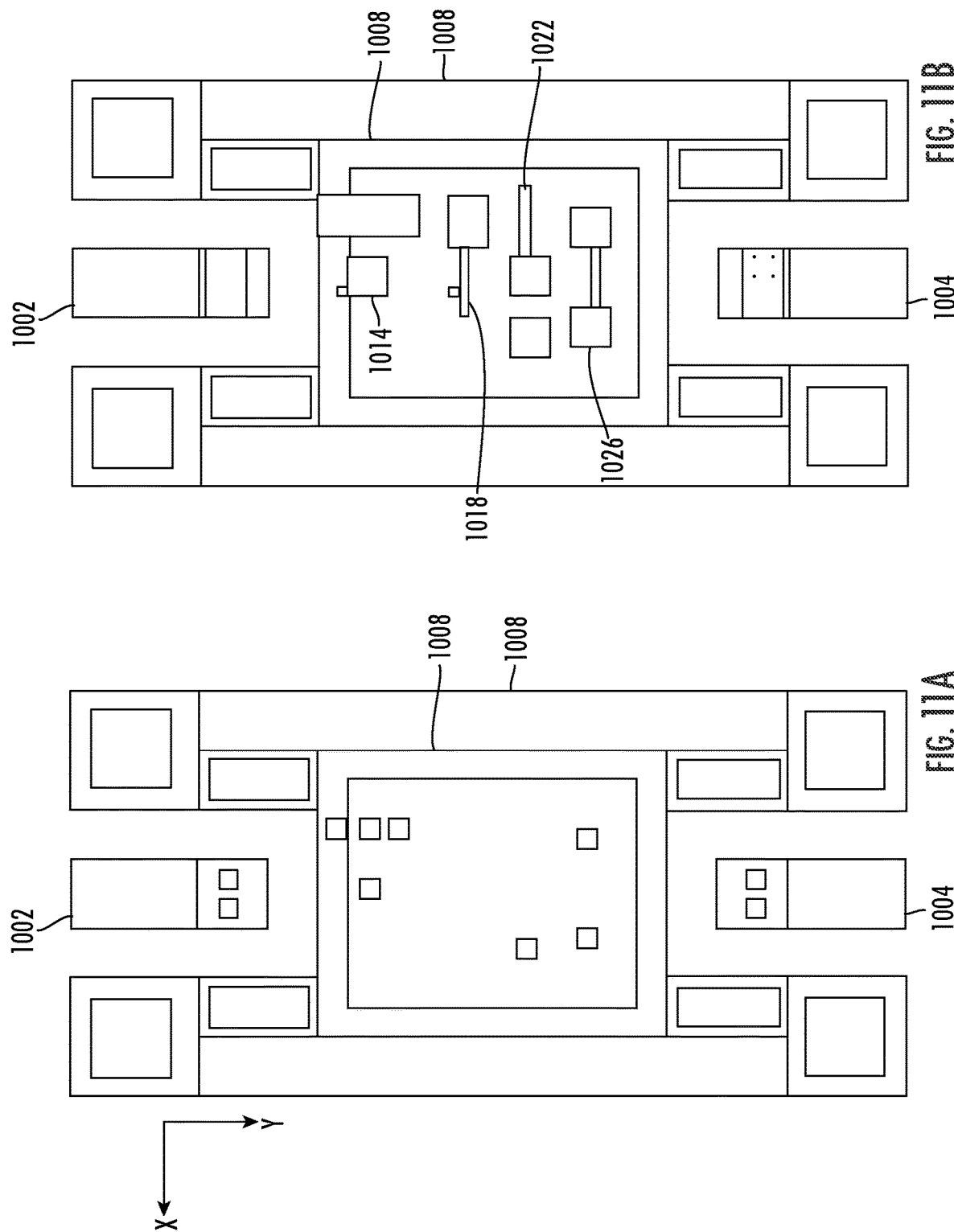

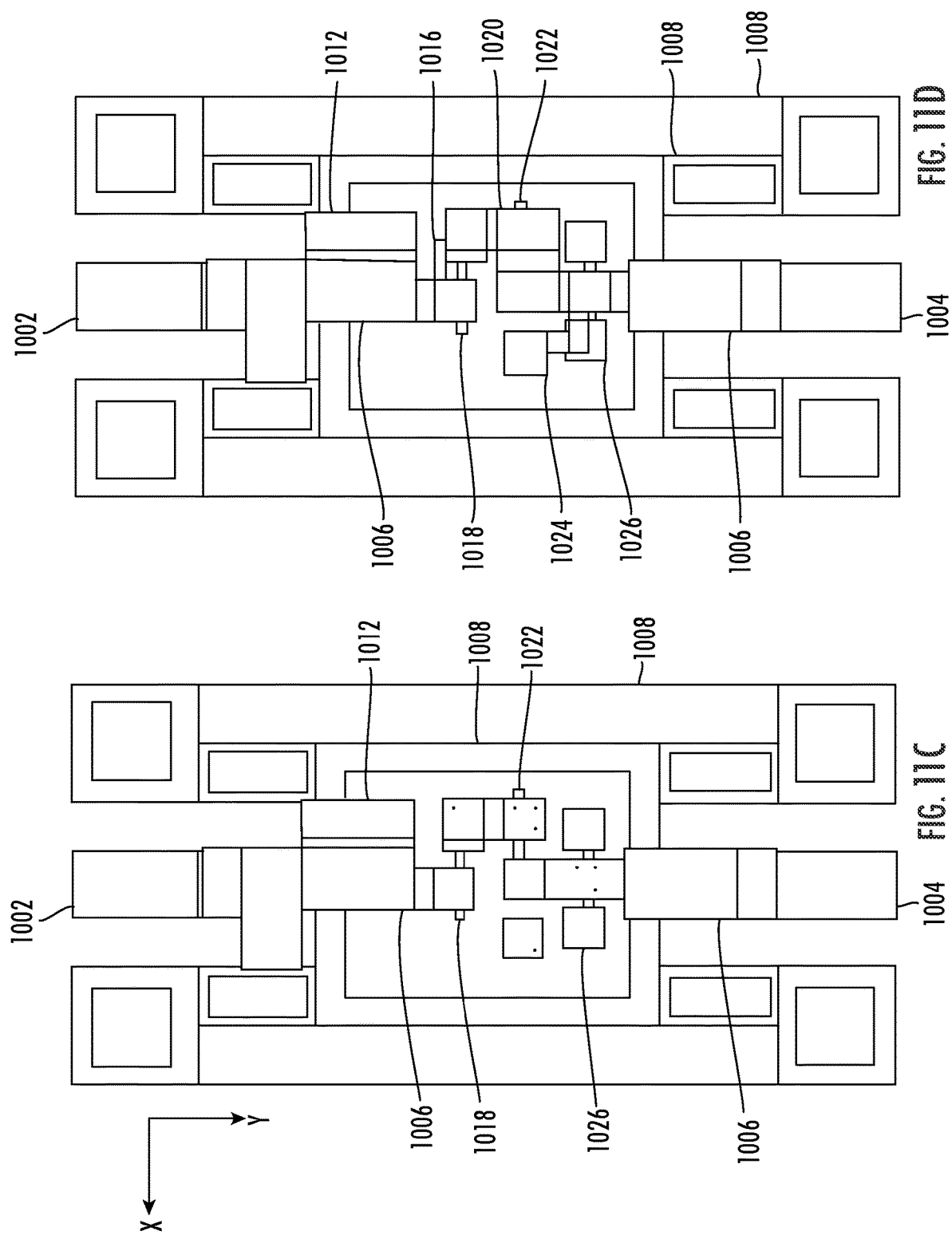

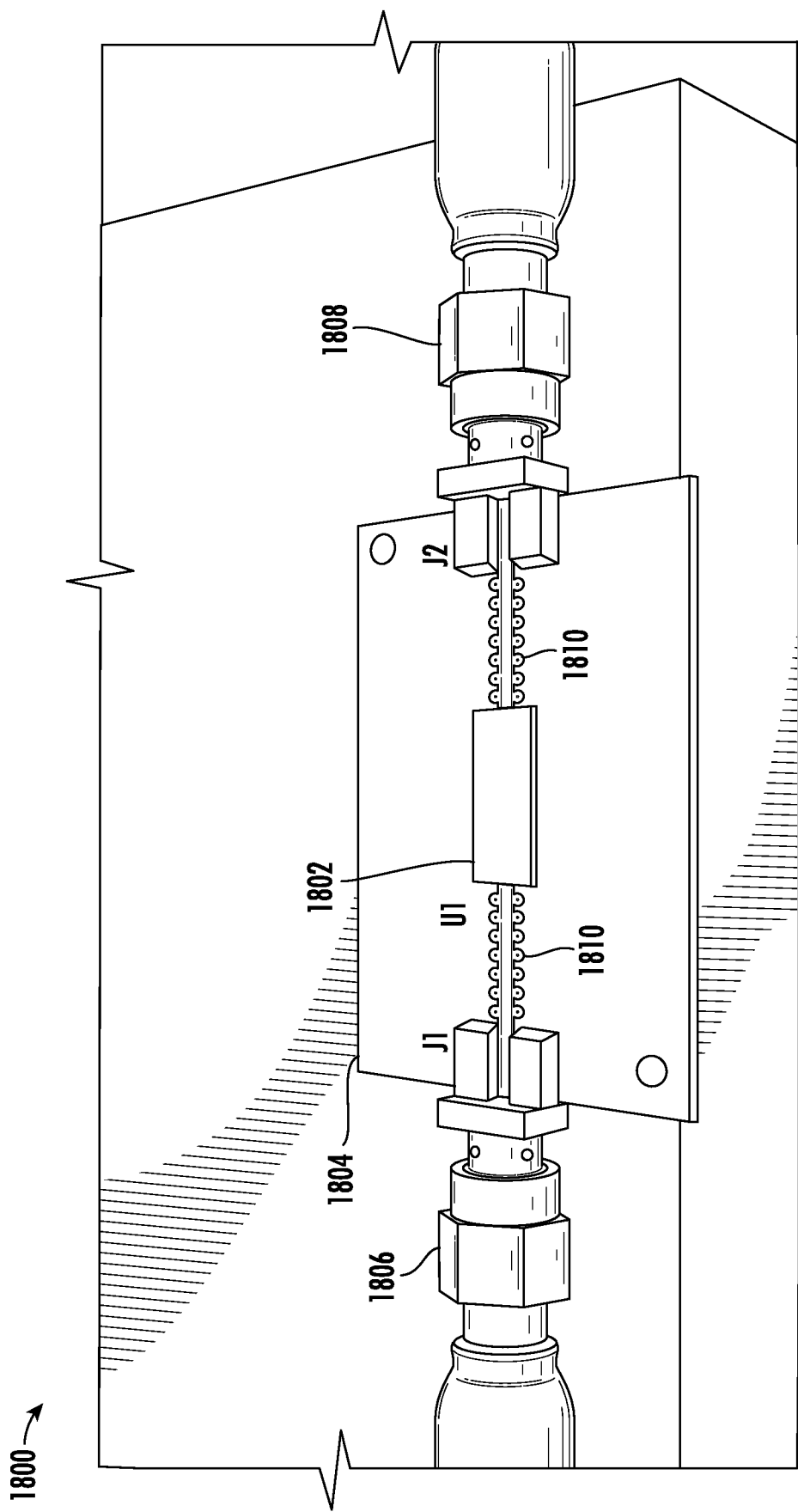

US 11,336,249 B2

MULTILAYER FILTER INCLUDING A CAPACITOR CONNECTED WITH AT LEAST TWO VIAS

CROSS REFERENCE TO RELATED APPLICATION

The present application claims filing benefit of U.S. Provisional Patent Application Ser. No. 62/782,488 having a filing date of Dec. 20, 2018, which is incorporated herein by reference in its entirety.

BACKGROUND OF THE DISCLOSURE

Electric filters perform many functions and are employed in a variety of electrical devices. Multilayer filters sometimes include one or more capacitors that are designed to provide very low capacitance values. For example, such capacitors may be useful for filtering high frequency signals, such as high frequency radio signal communication. The demand for increased data transmission speed for wireless connectivity has driven demand for high frequency components, including those configured to operate at high frequencies, including 5G spectrum frequencies.

Obtaining low capacitance values requires capacitors having smaller capacitive areas. Additionally, capacitors may exhibit parasitic inductance that can negatively affect performance of the multilayer filter, especially at high frequencies. As such, a multilayer filter including a capacitor having a small capacitive area and/or low inductance would be welcomed in the art.

SUMMARY OF THE DISCLOSURE

In accordance with one embodiment of the present disclosure, a multilayer filter may include a plurality of dielectric layers stacked in a Z-direction that is perpendicular to each of a first direction and a second direction. The first direction is perpendicular to the second direction. A first conductive layer may overlie one of the plurality of dielectric layers, and a second conductive layer may overlie another of the plurality of dielectric layers and be spaced apart from the first conductive layer in the Z-direction. A first via may be connected with the second conductive layer at a first location. A second via may be connected with the second conductive layer at a second location that is spaced apart in the first direction from the first location. The first conductive layer may overlap the second conductive layer in each of the first direction and second direction at an overlapping area to form a capacitor. At least a portion of the overlapping area may be located between the first location and the second location in the first direction. The second conductive layer may be free of via connections that intersect the overlapping area in each of the first direction and second direction.

In accordance with another embodiment of the present disclosure, a method of forming a multilayer filter may include providing a plurality of dielectric layers, forming a first conductive layer overlying one of the plurality of dielectric layers, and forming a second conductive layer overlying another of the plurality of dielectric layers and spaced apart from the first conductive layer in the Z-direction. The method may include forming a first via connected with the second conductive layer at a first location and a second via connected with the second conductive layer at a second location that is spaced apart in the first direction from the first location. The method may include stacking the plurality of dielectric layers such that the first conductive layer overlaps the second conductive layer in each of the first direction and second direction at an overlapping area to form a capacitor. At least a portion of the overlapping area may be located between the first location and the second location in the first direction. The second conductive layer may be free of via connections that intersect the overlapping area in each of the first direction and second direction.

BRIEF DESCRIPTION OF THE DRAWINGS

A full and enabling disclosure of the present disclosure, including the best mode thereof, directed to one of ordinary skill in the art, is set forth more particularly in the remainder of the specification, which makes reference to the appended figures, in which:

FIGS. 4A through 4E are a series of sequential top down views of the filter in which an additional layer is shown in each sequential figure;

FIGS. 7A through 7D are a series of sequential top down views of the filter of FIGS. 8A and 8B in which an additional layer is shown in each sequential figure;

FIGS. 9A through 9D are a series of sequential top down views of the filter of FIGS. 8A and 8B in which an additional layer is shown in each sequential Figure;

FIGS. 11A through 11D are a series of sequential top down views of the filter of FIGS. 10A and 10B in which an additional layer is shown in each sequential figure;

FIG. 15 is a plot of simulation data including insertion loss and return loss values from a computer analysis of a filter according to aspects of the present disclosure;

FIG. 18 is a perspective view of a testing assembly including a filter according to aspects of the present disclosure.

Figure 1:
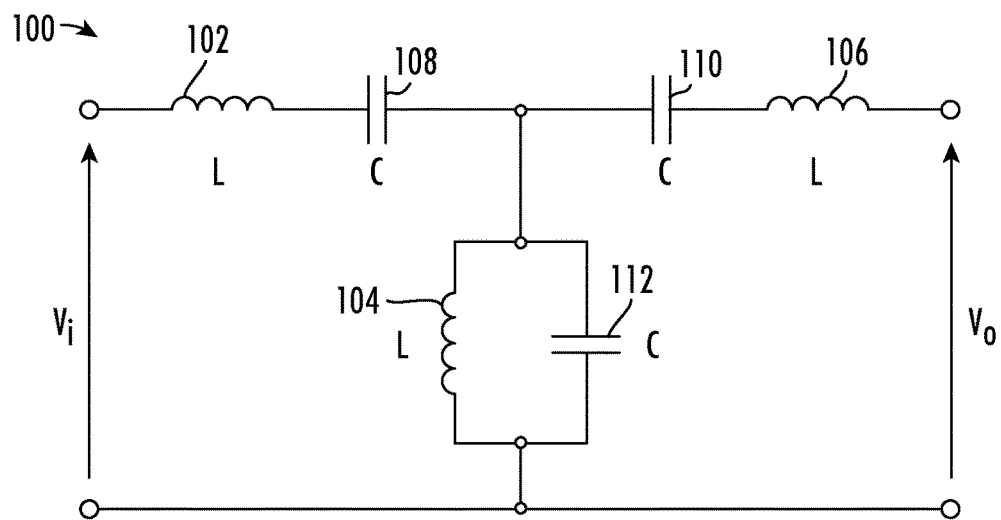
FIG. 1 is a simplified schematic of a band pass filter according to aspects of the present disclosure.

Repeat use of reference characters in the present specification and drawings is intended to represent same or analogous features or elements of the disclosure.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present disclosure, which broader aspects are embodied in the exemplary construction.

Generally speaking, the present disclosure is directed to a multilayer filter including a capacitor connected with a pair of vias arranged to minimize inductance of the capacitor and/or allow the capacitor to have a very small capacitive area. The multilayer filter may include a plurality of dielectric layers stacked in a Z-direction. A first conductive layer may overlie one of the plurality of dielectric layers, and a second conductive layer may overlie another of the plurality of dielectric layers and be spaced apart from the first conductive layer in the Z-direction. The Z-direction is perpendicular to each of a first direction (e.g., the X-direction) and a second direction (e.g., the Y-direction).

A first via may be connected with the second conductive layer at a first location. A second via may be connected with the second conductive layer at a second location that is spaced apart in the first direction (e.g., the X-direction) from the first location.

The second conductive layer may overlap the first conductive layer in each of the first direction (e.g., X-direction) and the second direction (e.g., Y-direction) at an overlapping area to form a capacitor. At least a portion of the overlapping area may be located between the first location and the second location in the first direction (e.g., X-direction).

The arrangement of the pair of vias may reduce voltage across the second conductive layer, which may result in the capacitor exhibiting a low inductance. In some embodiments, the second conductive layer may be free of vias inside the capacitive area. This may reduce the capacitance of the capacitor by reducing metallization proximate the overlapping area and/or by allowing the capacitive area to be smaller than otherwise possible (e.g., smaller than a width of the vias).

The multilayer filter may include one or more dielectric materials. In some embodiments, the one or more dielectric materials may have a low dielectric constant. The dielectric constant may be less than about 100, in some embodiments less than about 75, in some embodiments less than about 50, in some embodiments less than about 25, in some embodiments less than about 15, and in some embodiments less than about 5. For example, in some embodiments, the dielectric constant may range from about 1.5 and 100, in some embodiments from about 1.5 to about 75, and in some embodiments from about 2 to about 8. The dielectric constant may be determined in accordance with IPC TM-650 2.5.5.3 at an operating temperature of 25° C. and frequency of 1 MHz. The dielectric loss tangent may range from about 0.001 to about 0.04, in some embodiments from about 0.0015 to about 0.0025.

In some embodiments, the one or more dielectric materials may include organic dielectric materials. Example organic dielectric include polyphenyl ether (PPE) based materials, such as LD621 from Polyclad and N6000 series from Park/Nelco Corporation, liquid crystalline polymer (LCP), such as LCP from Rogers Corporation or W. L. Gore & Associates, Inc., hydrocarbon composites, such as 4000 series from Rogers Corporation, and epoxy-based laminates, such as N4000 series from Park/Nelco Corp. For instance, examples include epoxy based N4000-13, bromine-free material laminated to LCP, organic layers with high K material, unfilled high-K organic layers, Rogers 4350, Rogers 4003 material, and other theremoplastic materials such as polyphenylene sulfide resins, polyethylene terephthalate resins, polybutylene terephthalate resins, polyethylene sulfide resins, polyether ketone resins, polytetraflouroethylene resins and graft resins, or similar low dielectric constant, low-loss organic material.

In some embodiments, the dielectric material may be a ceramic-filled epoxy. For example, the dielectric material may include an organic compound, such as a polymer (e.g., an epoxy) and may contain particles of a ceramic dielectric material, such as barium titanate, calcium titanate, zinc oxide, alumina with low-fire glass, or other suitable ceramic or glass-bonded materials.

Other materials may be utilized, however, including, N6000, epoxy based N4000-13, bromine-free material laminated to LCP, organic layers with high K material, unfilled high-K organic layers, Rogers 4350, Rogers 4003 material (from the Rogers Corporation), and other theremoplastic materials such as hydrocarbon, Teflon, FR4, epoxy, polyamide, polyimide, and acrylate, polyphenylene sulfide resins, polyethylene terephthalate resins, polybutylene terephthalate resins, polyethylene sulfide resins, polyether ketone reszns, polytetraflouroethylene resins, BT resin composites (e.g., Speedboard C), thermosets (e.g., Hitachi MCL-LX-67F), and graft resins, or similar low dielectric constant, low-loss organic material.

Additionally, in some embodiments, non-organic dielectric materials may be used including a ceramic, semi-conductive, or insulating materials, such as, but not limited to barium titanate, calcium titanate, zinc oxide, alumina with low-fire glass, or other suitable ceramic or glass-bonded materials. Alternatively, the dielectric material may be an organic compound such as an epoxy (with or without ceramic mixed in, with or without fiberglass), popular as circuit board materials, or other plastics common as dielectrics. In these cases, the conductor is usually a copper foil which is chemically etched to provide the patterns. In still further embodiments, dielectric material may comprise a material having a relatively high dielectric constant (K), such as one of NPO (COG), X7R, X5R X7S, ZSU, Y5V and strontium titanate. In such examples, the dielectric material may have a dielectric constant that is greater than 100, for example within a range from between about 100 to about 4000, in some embodiments from about 1000 to about 3000.

In some embodiments, the multilayer filter may include a signal path having an input and an output. The signal path may include one or more conductive layers overlying one or more of the dielectric layers. The conductive layers may include a variety of conductive materials. For example, the conductive layers may include copper, nickel, gold, silver, or other metals or alloys. The conductive layers may be formed directly on the respective dielectric layers. Alternatively, one or more intermediate layers or coating may be arranged between the conductive layers and the respective dielectric layers. As used herein, "formed on" may refer to either a conductive layer that is directly formed on a dielectric layer or a conductive layer that overlies the dielectric layer with an intermediate layer or coating therebetween.

The conductive layers may be formed using a variety of suitable techniques. Subtractive, semi-additive or fully additive processes may be employed with panel or pattern electroplating of the conductive material followed by print and etch steps to define the patterned conductive layers. Photolithography, plating (e.g., electrolytic), sputtering, vacuum deposition, printing, or other techniques may be used to for form the conductive layers. For example, a thin layer (e.g., a foil) of a conductive material may be adhered (e.g., laminated) to a surface of a dielectric layer. The thin layer of conductive material may be selectively etched using a mask and photolithography to produce a desired pattern of the conductive material on the surface of the dielectric material.

A finite resolution or feature size is achievable regardless of the particular process employed. A "minimum line width" may be defined as the smallest, accurately producible feature size of the process or processes employed. In some embodiments, the minimum line width may be about 100 microns or less, in some embodiments about 75 microns or less, and in some embodiments about 50 microns or less. A "minimum area unit" may be defined as the minimum line width squared. The minimum area unit may be about 0.01 mm$^2$ or less, in some embodiments about 0.0052 mm$^2$ or less, and in some embodiments about 0.0026 mm$^2$ or less.

In some embodiments, the multilayer filter may include one or more vias formed in one or more of the dielectric layers. For example, a via may electrically connect a conductive layer on one dielectric layer with a conductive layer on another dielectric layer. The via may include a variety of conductive materials, such as copper, nickel, gold, silver, or other metals or alloys. The vias may be formed by drilling (e.g., mechanical drilling, laser drilling, etc.) through holes and plating the through holes with a conductive material, for example using electroless plating or seeded copper. The vias may be filled with conductive material such that a solid column of conductive material is formed. Alternatively, the interior surfaces of the through holes may be plated such that the vias are hollow. The vias may have lengths in the Z-direction that are than about 180 microns, in some embodiments less than about 100 microns, and in some embodiments less than about 80 microns.

In some embodiments, at least some of the dielectric layers may have thicknesses that are less than about 180 microns, in some embodiments less than about 120 microns, in some embodiments less than about 100 microns in some embodiments less than about 80 microns, in some embodiments less than 60 microns, in some embodiments less than about 50 microns, in some embodiments less than about 40 microns, in some embodiments less than about 30 microns, and in some embodiments less than about 20 microns.

In some embodiments, the multilayer filter may be configured for operation at high frequencies. The multilayer filter may have a characteristic frequency (e.g., a low pass frequency, a high pass frequency, an upper bound of a bandpass frequency, or a lower bound of the bandpass frequency) that is greater than 6 GHz. In some embodiments, the filter may have a characteristic frequency that is greater than about 6 GHz, in some embodiments greater than about 10 GHz, in some embodiments greater than about 15 GHz, in some embodiments greater than about 20 GHz, in some embodiments greater than about 25 GHz, in some embodiments greater than about 30 GHz, in some embodiments greater than about 35 GHz, in some embodiments greater than about 40 GHz, in some embodiments greater than about 45 GHz, in some embodiments greater than about 50 GHz, in some embodiments greater than about 60 GHz, in some embodiments greater than about 70 GHz, and in some embodiments in some embodiments greater than about 80 GHz.

The multilayer filter may exhibit excellent performance characteristics, such as low insertion loss for frequencies within a pass band frequency range of the multilayer filter. For example, the average insertion loss for frequencies within the pass band frequency range may be greater than −15 dB, in some embodiments greater than −10 dB, in some embodiments greater than −5 dB, in some embodiments greater than −2.5 dB or more.

Additionally, the multilayer filter may exhibit excellent rejection of frequencies outside the pass band frequency range. In some embodiments, the insertion loss for frequencies outside the pass band frequency range may be less than about −15 dB, in some embodiments less than about −25 dB, in some embodiments less than about −35 dB, and in some embodiments less than about −40 dB.

Additionally, the multilayer filter may exhibit steep roll-off from the passband frequency range to frequencies outside the passband. For example, for frequencies immediately outside the passband frequency range, the insertion loss may decrease at a rate of about 0.1 dB/MHz, in some embodiments greater than about 0.2 dB/MHz, in some embodiments greater than about 0.3 dB/MHz, and in some embodiments greater than about 0.4 dB/MHz.

The multilayer filter may also exhibit consistent performance characteristics (e.g., insertion loss, return loss, etc.) across a wide range of temperatures. In some embodiments, the insertion loss of the multilayer filter may vary less than 5 dB or less across large temperature ranges. For example, the multilayer filter can exhibit a first insertion loss at about 25° C. and at a first frequency. The multilayer filter can exhibit a second insertion loss at a second temperature and at about the first frequency. A temperature difference between the first temperature and the second temperature can be about 70° C. or greater, in some embodiments about 60° C. or greater, in some embodiments about 50° C. or greater, in some embodiments about 30° C. or greater, and in some embodiments about 20° C. or greater. As an example, the first temperature can be 25° C., and the second temperature can be 85° C. As another example, the first temperature can be 25° C., and the second temperature can be −55° C. The difference between the second insertion loss and the first insertion loss can be about 5 dB or less, in some embodiments about 2 dB or less, in some embodiments about 1 dB or less, in some embodiments, about 0.75 dB or less, in some embodiments about 0.5 dB or less, and in some embodiments, about 0.2 dB or less.

In some embodiments, the multilayer filter may have an overall length that ranges from about 0.5 mm to about 30 mm, in some embodiments, from about 1 mm to about 15 mm, and in some embodiments from about 2 mm to about 8 mm.

In some embodiments, the multilayer filter may have an overall width that ranges from about 0.2 mm to about 20 mm, in some embodiments from about 0.5 mm to about 15 mm, in some embodiments from about 1 mm to about 10 mm, and in some embodiments from about 2 mm to about 8 mm.

The multilayer filter may generally be low-profile or thin. For example, in some embodiments, the multilayer filter may have an overall thickness that ranges from about 100 microns to about 2 mm, in some embodiments from about 150 microns to about 1 mm, and in some embodiments from about 200 microns to about 300 microns.

Regardless of the particular configuration employed, the present inventors have discovered that through selective control over the shape and arrangement of conductive layers that form a capacitor, a low inductance and/or low capacitance capacitor can be achieved. More specifically, an overlapping or capacitive area may be formed between the conductive layers. A pair of vias may be connected with one of the conductive layers and arranged on each side of the overlapping area, which may reduce or prevent voltage differences across the conductive layer. Parasitic inductance associated with the capacitor may be reduced. Additionally, in some embodiments, the overlapping area may be free of connection with vias, which may allow the overlapping area to be very small. For example, the overlapping area may have a width that is smaller than a width of one or more of the vias. As a result, the capacitor may exhibit a very low capacitance.

The capacitor may be insensitive to small, relative misalignment between the dielectric layers on which the conductive layers are formed. As such, the capacitor may be described as "self-aligning." For example, the first conductive layer may be elongated in a first direction and may overlap the second conductive layer such that the edges of the second capacitor bound the overlapping area in the first direction. The edges of the first conductive layer may bound the overlapping area in a second direction that is perpendicular to the first direction.

At least a portion of the overlapping area may be located between the first location of the first via and the second location of the second via in the X-direction. In some embodiments, the overlapping area may be located entirely between the first location and the second location in the X-direction.

The first location and second location may be spaced apart by a spacing distance in the first direction (e.g., the X-direction). The spacing distance may range from about 20 microns to about 2 mm, or more, in some embodiments from about 50 microns to about 1 mm, in some embodiments from about 100 microns to 800 microns, in some embodiments from about 200 microns to about 600 microns, e.g., about 400 microns.

The first location and second location may be approximately aligned in the second direction (e.g., the Y-direction). For example, the first location of the first via may be aligned with the second location of the second via in the second direction (e.g., the Y-direction) by less than about 200 microns, in some embodiments less than about 100 microns, in some embodiments less than about 50 microns, in some embodiments less than about 20 microns, and in some embodiments less than about 5 microns.

The first conductive layer may have a width at the overlapping area in the first direction (e.g., the X-direction). In some embodiments, the width of the first conductive layer may be less than or equal to the spacing distance. The width of the first conductive layer in the first direction (e.g., the X-direction) may range from about 25 microns to about 1 mm, in some embodiments from about 50 microns to about 800 microns, in some embodiments from about 75 microns to about 600 microns, in some embodiments from about 100 microns to about 300 microns, e.g., about 200 microns.

The second conductive layer may be free of via connections that intersect the overlapping area in the X-Y plane. In some embodiments, each of the first conductive layer and the second conductive layer may be free of via connections that intersect the overlapping area in an X-Y plane that is parallel with the X-direction and Y-direction.

The second conductive layer may be elongated in the first direction (e.g., the X-direction) between a first end portion and a second end portion. The first location may be located within the first end portion, and the second location may be located within the second end portion. In some embodiments, the second conductive layer may have a middle portion that is connected between the first end portion and the second end portion. The middle portion may have a width in the second direction (e.g., the Y-direction). The width of the middle portion may range from about 10 microns to about 1 mm, in some embodiments from about 20 microns to about 800 microns, in some embodiments from about 30 microns to about 400 microns, in some embodiments from about 40 microns to about 200 microns, e.g., about 50 microns. In some embodiments, the middle portion may have a width equal to a single "minimum line width." As noted above, the minimum line width may be the smallest, accurately producible feature size of the process or processes employed to form the conductive layers.

At least one of the first end portion or the second end portion may have a width in the Y-direction that is greater than the width of the middle portion. This may facilitate connection of the vias with the end portions. Such a configuration may permit the overlapping area to have a width in the Y-direction that is less than a width of one or both vias.

The vias may have widths in the X-Y plane that range from about 20 microns to about 500 microns, in some embodiments from about 30 microns to about 300 microns, in some embodiments from 50 microns to about 150 microns. The vias may have lengths in the Z-direction that are than about 180 microns, in some embodiments less than about 100 microns, and in some embodiments less than about 80 microns.

The capacitor may have a small overlapping area between electrodes of the capacitor (e.g., capacitive area). For example, in some embodiments the capacitive area of the capacitor may be less than about 0.5 square millimeters ($mm^2$), in some embodiments less than about 0.3 $mm^2$, in some embodiments less than about 0.2 $mm^2$, in some embodiments less than about 0.1 $mm^2$, in some embodiments less than about 0.07 $mm^2$, in some embodiments less than about 0.05 $mm^2$, in some embodiments less than about 0.03 $mm^2$, in some embodiments less than about 0.02 $mm^2$, and in some embodiments less than about 0.015 $mm^2$. In some embodiments, the capacitive area may be less than about 35 minimum area units, in some embodiments less than about 20 minimum area units, in some embodiments less than about 8 minimum area units, in some embodiments less than about 5 minimum area units, in some embodiments less than about 4 minimum area units, and in some embodiments about 2 minimum area units or less.

The overlapping area may have a relatively high aspect ratio. For example, in some embodiments a ratio of a length of the overlapping area (e.g., in the X-direction) to a width of the overlapping area (e.g., in the Y-direction) may be greater than about 1.5, in some embodiments greater than about 2, in some embodiments greater than about 3, e.g., about 4.

The overlapping area may be spaced apart from the first location of the first via and/or the second location of the second via in the first direction (e.g., in the X-direction). For example, the overlapping area may be spaced apart from the first location by a first distance in the first direction (e.g., in the X-direction) and from the second location by a second distance in the first direction (e.g., in the X-direction). One or both of the first distance and second distance may be greater than about 10 microns, in some embodiments greater than about 20 microns, in some embodiments greater than about 30 microns, in some embodiments greater than about 40 microns, in some embodiments greater than about 50 microns, in some embodiments greater than about 100 microns, in some embodiments greater than about 200 microns, in some embodiments greater than about 400 microns.

The first conductive layer and second conductive layer may be spaced apart in the Z-direction by less than about 500 microns, in some embodiments less than about 400 microns, in some embodiments less than about 300 microns, in some embodiments less than about 200 microns, and in some embodiments less than about 100 microns, in some embodiments less than about 50 microns, in some embodiments less than about 40 microns (e.g., about 20 microns).

The filter may include a first layer of a first dielectric material between electrodes of the capacitor(s). The first dielectric material may be distinct from a second dielectric material of another layer of the filter. For example, the first dielectric material between the electrodes may comprise a ceramic-filled epoxy. The first dielectric material may have a dielectric constant that ranges from about 5 to about 9, in some embodiments from about 6 to about 8. The second dielectric material may comprise an organic dielectric material, for example, as described above. The second dielectric material may have a dielectric constant that ranges from about 1 to about 5, in some embodiments from about 2 to about 4.

I. Multilayer Filter

FIG. 1 is a simplified schematic of a high frequency multilayer filter 100 according to aspects of the present disclosure. The filter 100 may include one or more inductors 102, 104, 106, and one or more capacitors 108, 110, 112. An input voltage (represented by $V_i$ in FIG. 1) may be input to the filter 100, and an output voltage (represented by $V_O$ in FIG. 1) may be output by the filter 100. The band pass filter 100 may significantly reduce low and high frequencies while allowing frequencies within a passband frequency range to be transmitted through the filter 100 substantially unaffected. It should be understood that the simplified filter 100 described above is merely a simplified example of a band pass filter and that aspects of the present disclosure may be applied to more complex band pass filters. Additionally, aspects of the present disclosure may be applied to other types of filters, including, for example, a low-pass filter or a high-pass filter.

Figure 2:
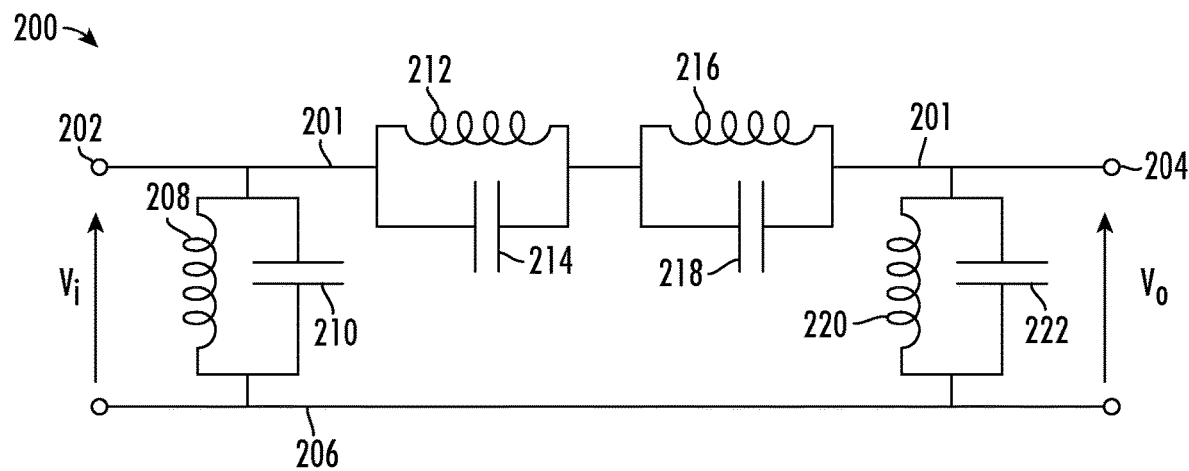
FIG. 2 is a simplified schematic of another band pass filter according to aspects of the present disclosure.

FIG. 2 is a schematic of an example embodiment of a band pass filter 200 according to aspects of the present disclosure. A signal path 201 may be defined between an input 202 and an output 204 of the filter 200. An input voltage (represented by $V_i$ in FIG. 1) may be input to the filter 200 between the input 202 and a ground 206 of the filter 200. An output voltage (represented by $V_O$ in FIG. 1) may be output by the filter 200 between the output 204 and the ground 206.

The filter 200 may include a first inductor 208 and a first capacitor 210 electrically connected in parallel with each other. The first inductor 208 and first capacitor 210 may be electrically connected between the signal path 201 and the ground 206. The filter 200 may include a second inductor 212 and second capacitor 214 electrically connected in parallel with each other. The second inductor 212 and second capacitor 214 may be connected in series with the signal path 201 (e.g., may form a portion of the signal path 201). The filter 200 may include a third inductor 210 and third capacitor 214 electrically connected in parallel with each other. The third inductor 210 and third capacitor 214 may be electrically connected between the signal path 201 and the ground 206. The third inductor 210 and third capacitor 214 may be connected in series with the signal path 201 (e.g., may form a portion of the signal path 201). The filter 200 may include a fourth inductor 220 and fourth capacitor 222 electrically connected in parallel with each other. The fourth inductor 220 and fourth capacitor 222 may be electrically connected between the signal path 201 and the ground 206.

The inductance values of the inductors 208, 212, 216, 220 and the capacitance values of the capacitors 210, 214, 218, 222 may be selected to produce the desired band pass frequency range of the band pass filter 200. The band pass filter 200 may significantly reduce frequencies outside of the passband frequency range while allowing frequencies within a passband frequency range to be transmitted through the filter 200 substantially unaffected.

Figure 3A:
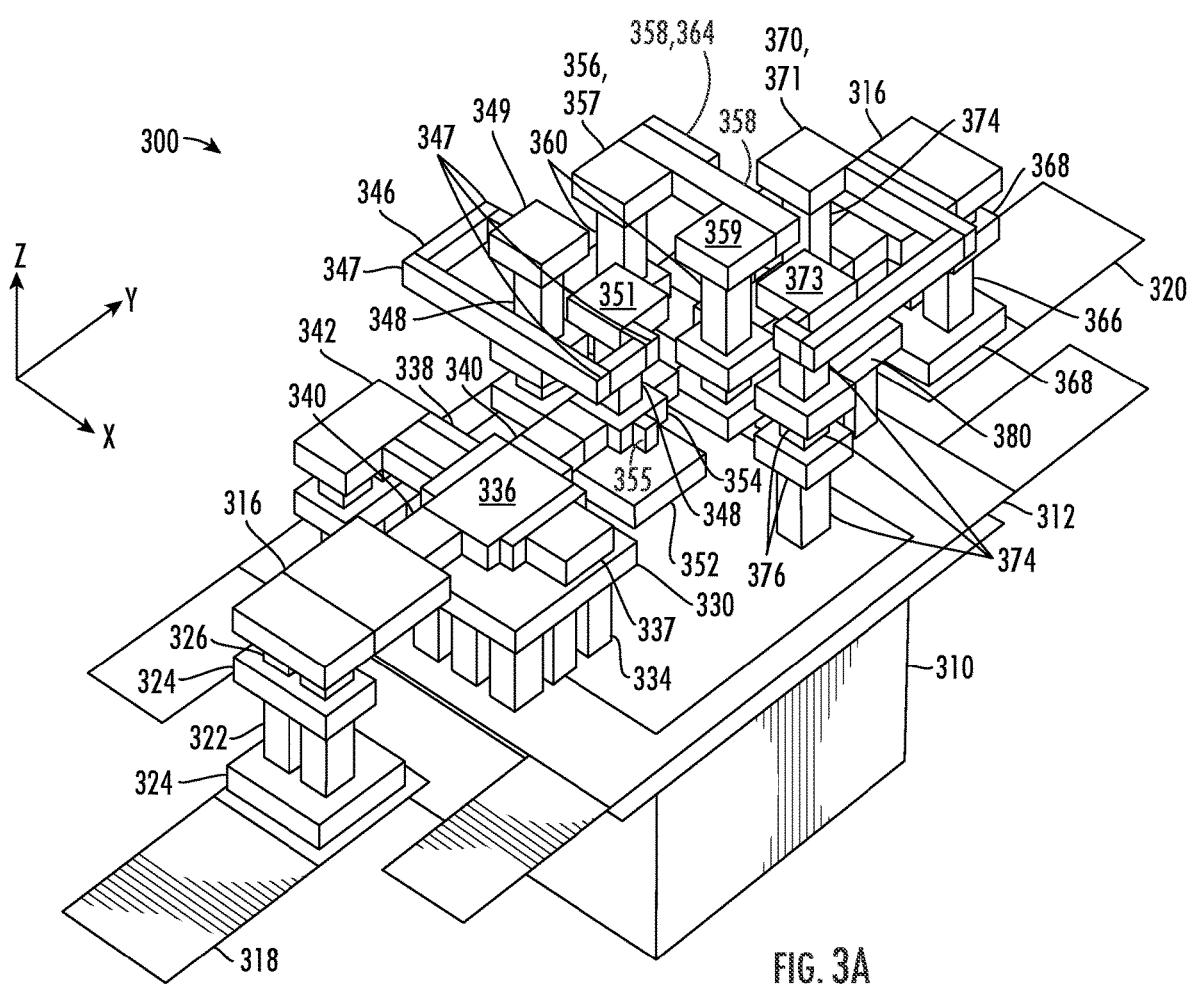
FIGS. 3A and 3B are perspective views of an example band pass filter according to aspects of the present disclosure.
Figure 3B:
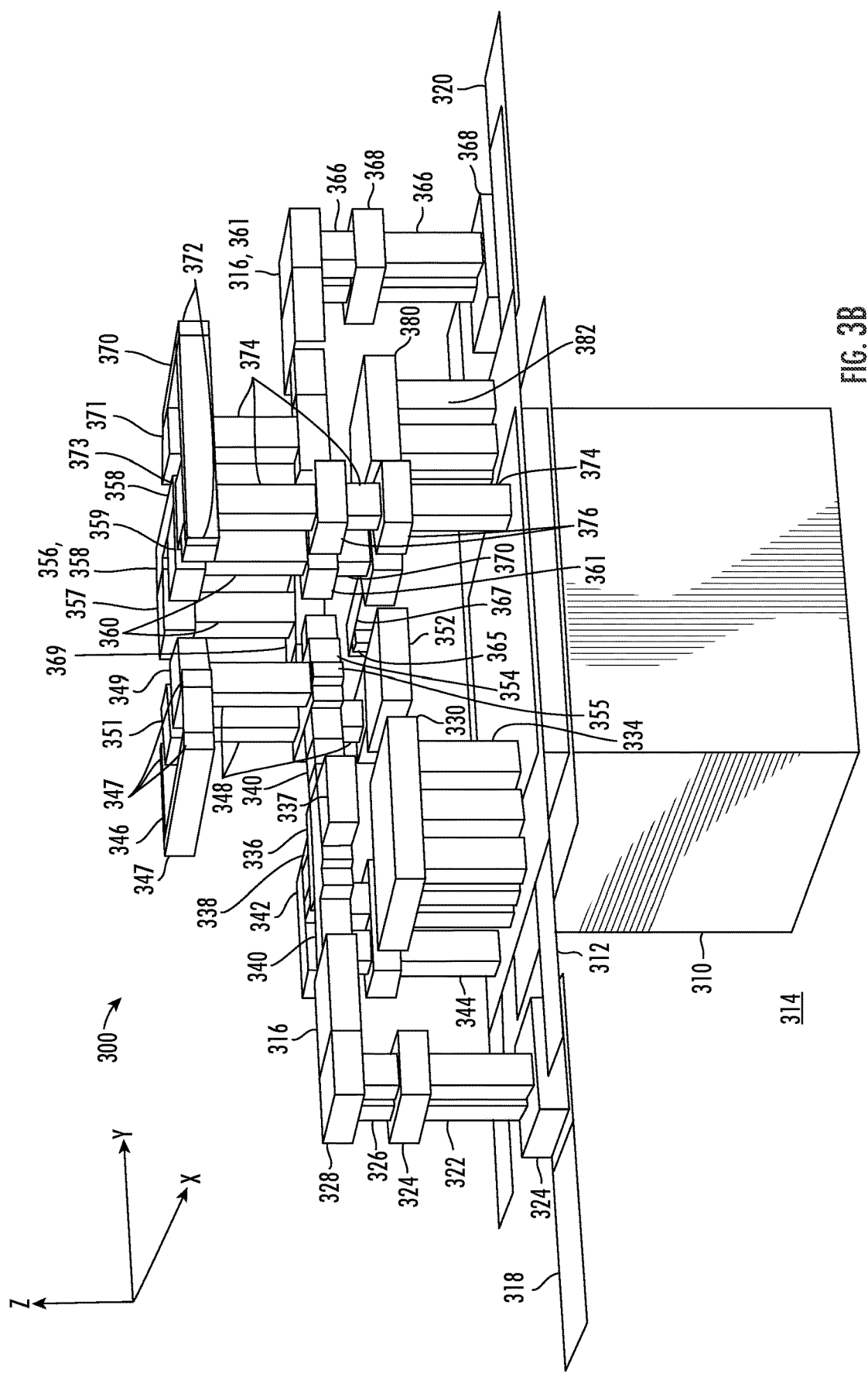
Figure 3C:
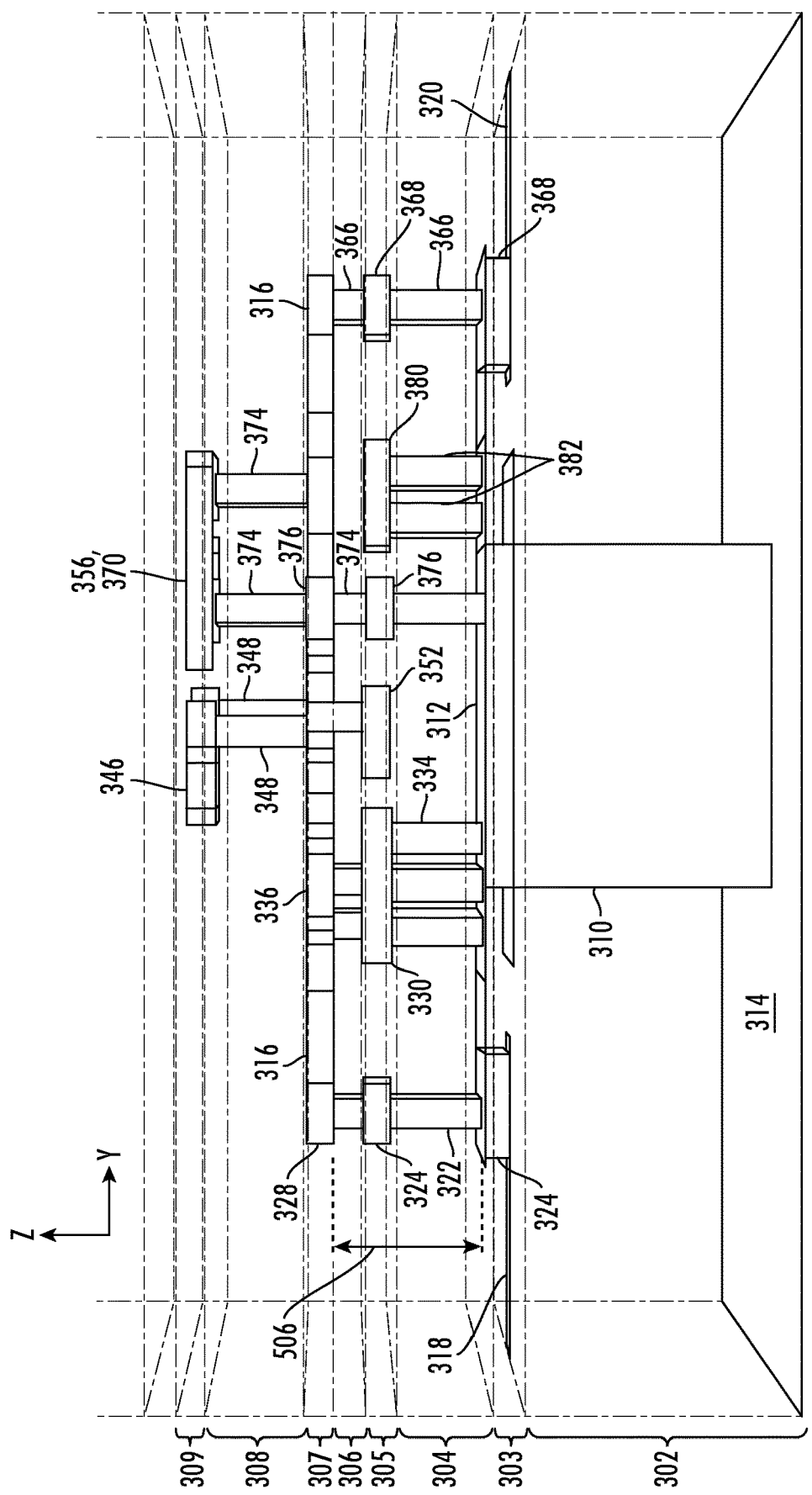
FIG. 3C is a side elevation view of the filter of FIGS. 3A and 3B.

FIGS. 3A and 3B are perspective views of an example band pass filter 300 according to aspects of the present disclosure. FIG. 3C is a side elevation view of the filter 300 of FIGS. 3A and 3B. Referring to FIGS. 3A through 3C, the band pass filter 300 may include a plurality of dielectric layers (transparent for clarity). Referring to FIG. 3C, a first dielectric layer 304, second dielectric layer 306, and third dielectric layer 308 may be stacked to form a monolithic structure. The filter 300 may be mounted to a mounting surface 302, such as a printed circuit board. Conductive layers 303, 305, 307, 309 may be formed on the dielectric layers 304, 306, 308. Conductive layer 303 may be formed on a bottom surface of the first dielectric layer 304. Conductive layers 305, 307 may be formed on a top surface and a bottom surface, respectively of the second dielectric layer 306. A ground may include a ground plane 312 that is exposed and/or terminated along a bottom surface of the filter 300 (the bottom surface of conductive layer 303. The mounting surface may include one or more terminals 310 for connection with the ground plane 312.

FIGS. 4A through 4E are a series of sequential top down views of the filter 300 in which an additional layer is shown in each Figure. More specifically, FIG. 4A illustrates the mounting surface 302 and the first conductive layer 303. FIG. 4B illustrates the ground plane 312 formed on the bottom surface of the first dielectric layer 304. FIG. 4C additionally illustrates the conductive layer 305 formed on the top surface of the first dielectric layer 304. FIG. 4D additionally illustrates conductive layer 307 that is formed on the second dielectric layer 306. FIG. 4E illustrates the conductive layer 309 formed on the third layer 308. The dielectric layers 304, 306, 308 are transparent to show the relative relocations of the various patterned conductive layers 303, 305, 307, 309.

The band pass filter 300 may include a signal path 316 having an input 318 and an output 320. The signal path 316 may electrically connect the input 318 and the output 320. More specifically, the signal path 316 may include a plurality of dielectric layers and/or vias formed in and on the plurality of dielectric layers 304, 306, 308 and electrically connected between the input 318 and the output 320. The signal path 316 may include one or more vias 322 may electrically connecting the input 318 with an intermediary conductive layer 324 disposed between the first layer 304 and second layer 306. The signal path 316 may include one or more vias 326 electrically connecting the intermediary layer 324 with a conductive layer 328 formed on the second dielectric layer 306.

A first capacitor may be formed between a portion 336 of the signal path 316 formed on an upper surface of the second layer 360 and a conductive layer 330 formed on a lower surface of the second layer 306 of dielectric material. The second layer 306 may have a different dielectric constant than one or more of the other layers 304, 308. For example, the dielectric material of the second layer 306 having a dielectric constant that ranges from about 5 to about 8 in accordance with IPC TM-650 2.5.5.3 at an operating temperature of 25° C. and frequency of 1 MHz. One or more of the other layers 304, 308 may have a dielectric constant that ranges from about 1 to about 4 in accordance with IPC TM-650 2.5.5.3 at an operating temperature of 25° C. and frequency of 1 MHz.

The conductive layer 330 may be electrically connected with the ground plane 312. The first capacitor of the filter 300 may correspond with the first capacitor 210 of the circuit diagram 200 of FIG. 2. The conductive layer 330 may be capacitively coupled with a portion 336 of the signal path 316. The conductive layer 330 may be spaced apart from the portion 336 of the signal path 316 in a Z-direction. The conductive layer 330 may be electrically connected with the ground plane 312 by one or more vias 334.

The first capacitor may be insensitive to relative misalignment of the electrodes of the first capacitor, which may be described as being "self-aligning." As best seen in FIG. 4D, the portion 336 of the signal path 316 may generally be dimensionally smaller (e.g., in the X- and Y-directions) than the conductive layer 330 of the first capacitor. Additionally, the portion 336 of the signal path 316 may define connections in the X-Y plane with other elements and other parts of the signal path 316. Such connections may be sized such that a slight misalignment in the X-direction or Y-direction does not change a capacitive area of the first capacitor. More specifically, a size of an effective overlap area (e.g., in the X-Y plane) between the conductive layer 330 and the portion 336 of the signal path 316 may be insensitive to slight misalignment in the X-direction or Y-direction of the second and third layers 304, 306.

For example, the portion 336 of the signal path 316 may include a tab 337 (e.g., extending in the X-direction) that has a width (e.g., in the Y-direction) equal to a width (e.g., in the Y-direction) of the connector portion 338 on an opposite side of the portion 336. Similarly, connections 340 may extend from opposite sides of the portion 336 (e.g., in the Y-direction) that may have equal widths. As a result, relative misalignment in the Y-direction may not alter the overlapping area between the conductive layer 330 and the portion 336 of the signal path 316.

The filter 300 may include a first inductor 342 electrically connected with the signal path 316 and ground plane 312. The first inductor 342 of the filter 300 may correspond with the first inductor 208 of the circuit diagram 200 of FIG. 2. The first inductor 342 may be connected with the portion 336 of the signal path 316 that forms the first capacitor by a connector portion 338. The first inductor 342 may be electrically connected with the ground plane 312 by one or more vias 344 (best seen in FIG. 3B).

The signal path 316 of the filter 300 may include a second inductor 346, which may correspond with the second inductor 212 of the circuit diagram 200 of FIG. 2. The second inductor 346 may be formed on the third layer 308 (best seen in FIG. 3C). The second inductor 346 may be electrically connected at each of a first location 349 and a second location 351 with the signal path 316. In other words, the second inductor 346 may form a portion of the signal path 316 between the input 318 and the output 320.

One or more vias 348 may connect the second inductor 346 at the first location 349 with a portion 354 of the signal path 316 on the second layer 306 (best seen in FIGS. 3B, 4D, and 4E). One or more vias 348 may connect the first inductive element 346 at the second location 351 with each of a portion 369 of the signal path 316 on the top surface of the second layer 306 and with a conductive layer 352 on the bottom surface of the second layer 306 (which forms a second capacitor with the portion 354 of the signal path 316, described below). As best seen in FIGS. 3A and 4E, the inductor 346 may have four corners. As such, the first inductor 346 may form greater than half of a "loop."

The second capacitor may be formed between the conductive layer 352 and the portion 354 of the signal path 316. The second capacitor may correspond with the second capacitor 214 of the circuit diagram 200 of FIG. 2. The second capacitor may be a self-aligning capacitor.

The third inductor 356 of the filter 300 may correspond with the third inductor 216 of the circuit diagram 200 of FIG. 2. The third inductor 356 may be connected by one or more vias 360 at a first location 357 with the portion 369 of the signal path 316 that is connected with the second inductor 346. The third inductor 356 may be connected by one or more vias 360 at a second location 359 with the portion 361 of the signal path 316 that is connected with the output 320. The portion 361 of the signal path 316 may be electrically connected with the output 320 by one or more vias 366 and/or intermediary layers 368. In other words, the third inductor 356 may form a portion of the signal path 316 between the second inductor 346 and the output 320.

A third capacitor may be formed in parallel with third inductor 356. The third capacitor may correspond with the third capacitor 214 of the circuit diagram 200 of FIG. 2. The third capacitor of the filter 300 may include a conductive layer 367 that is capacitively coupled with the portion 369 of the signal path 316.

A fourth inductor 370 may be electrically connected with the signal path 316 at a first location 371 and with the ground plane 312 at a second location 373 by vias 374. The vias 374 may be connected by intermediary layers 376. The fourth inductor 370 of the filter 300 may correspond with the fourth inductor 220 of the of the circuit diagram 200 of FIG. 2 The fourth inductor 370 of the filter 300 may be connected with the signal path 316 at the portion 361 of the signal path 316 that is electrically connected with the output 320. The fourth inductor 370 may have three corners 372 and form approximately one quarter of a loop.

A fourth capacitor may include a conductive layer 380 that is capacitively coupled with the portion 361 of the signal path 316 that is connected with the output 320. The conductive layer 380 of the fourth capacitor may be electrically connected with the ground plane 312 by vias 382. The fourth capacitor may correspond with the fourth capacitor 222 of the circuit diagram 200 of FIG. 2.

II. Capacitor

Figure 5A:
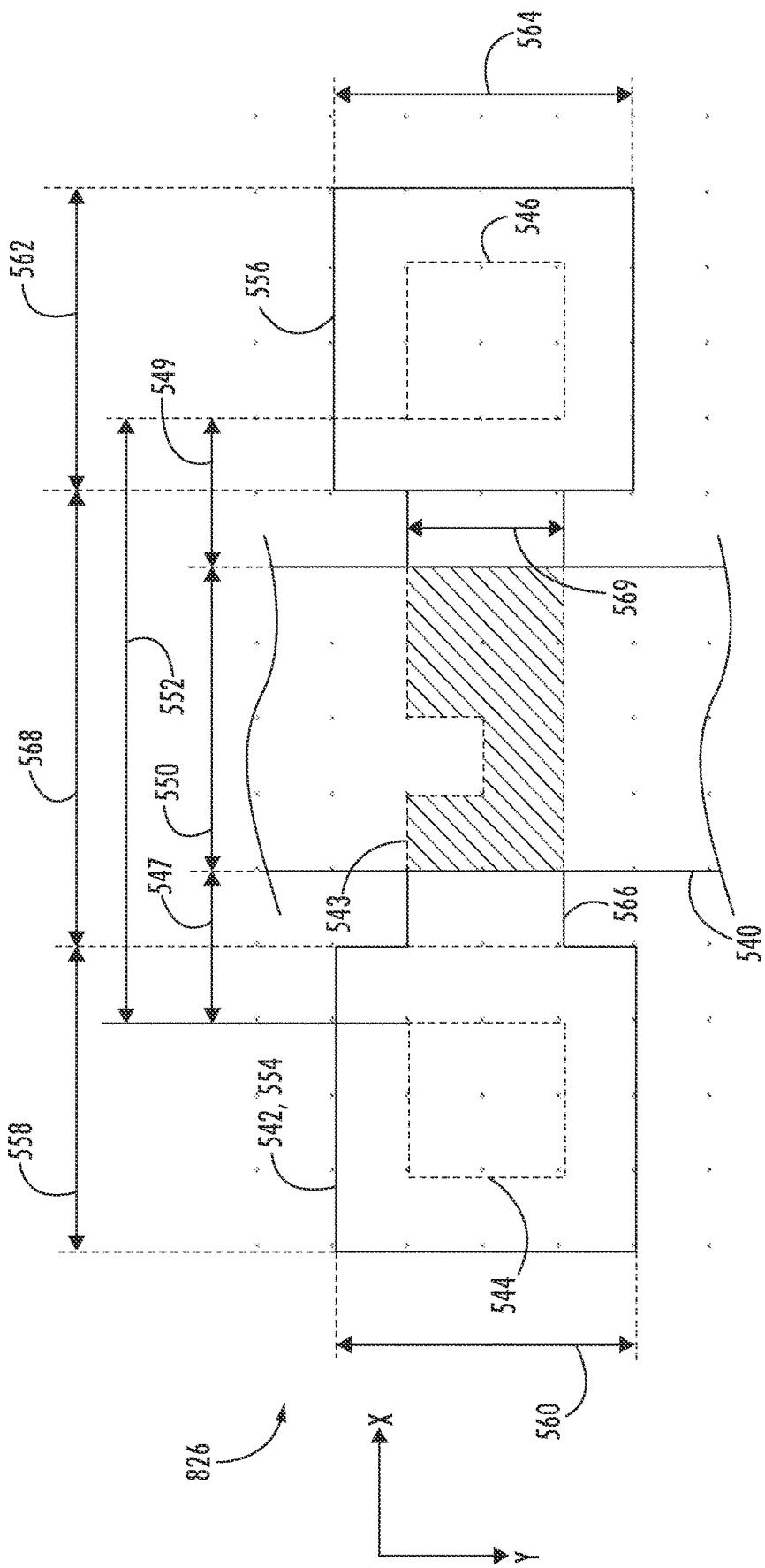
FIGS. 5A and 5B are top down views of the fourth capacitor of the multilayer filter of FIGS. 8A through 9D.

FIG. 5A is a top down view of a fourth capacitor 826 of a filter 800 described below with reference to FIGS. 8A through 9D. The filter 800 may generally be configured similarly to the filter 600 described above with reference to FIGS. 6A through 7D. The fourth capacitor 826 may include a first conductive layer 540 that is spaced apart in a Z-direction from a second conductive layer 542. The first conductive layer 540 may form part of a signal path 806 of the filter 800 as described below with reference to FIGS. 8A through 9D. The first conductive layer 540 may overlap the second conductive layer 542 in the X-Y plane at an overlapping area 543 to form the fourth capacitor 826. The first conductive layer 540 may be capacitively coupled with the second conductive layer 542 at the overlapping area 543. The first conductive layer 540 is generally free of direct electrical connection with the second conductive layer 542.

A first via 544 may be connected with the second conductive layer 542 at a first location. A second via 546 may be connected with the second conductive layer 522 at a second location. The first location of the first via 544 may be spaced apart from the second location of the second via 546 in the first direction (e.g., the X-direction). The first location of the first via 544 may be approximately aligned with the second location of the second via 546 in the second direction (e.g., the Y-direction). For example, the first location of the first via 544 may be aligned with the second location of the second via 546 in the second direction (e.g., the Y-direction) by less than about 200 microns.

Figure 5B:
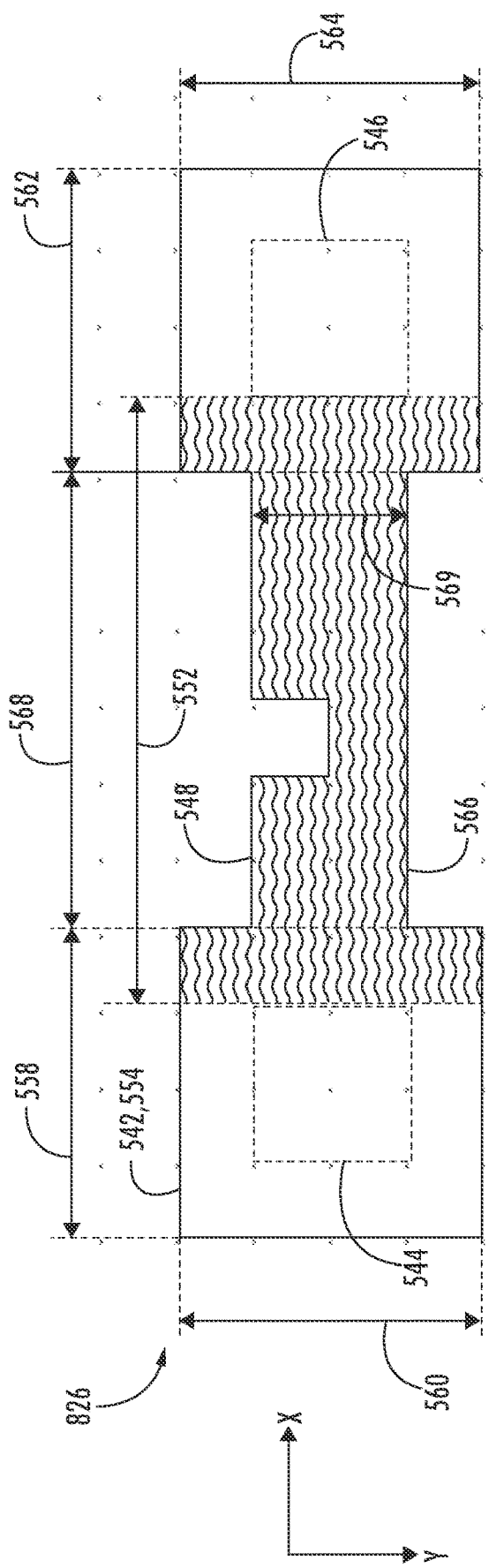

FIG. 5B is a top down view of the fourth capacitor 826 in which the first conductive layer 540 is omitted for clarity. An intermediary region 548 (represented by hatching having a zig-zag pattern in FIG. 5B) of the second conductive layer 542 may be defined between the first via 544 and the second via 546 in the X-direction. With reference to FIGS. 5A and 5B, at least a portion of the overlapping area 543 may be located between the first location of the first via 544 and the second location of the second via 546 in the X-direction. In other words, the overlapping area 543 may intersect the intermediary region 548. In this example, the overlapping area 543 is located entirely within the intermediary region 548.

Further the overlapping area 543 may be spaced apart from the first location 544 by a first distance 547 in the X-direction. The overlapping area 543 may be spaced apart from the second location 546 by a second distance 549 in the X-direction. One or both of the first distance 547 and second distance 549 may be greater than about 10 microns. In this example, the first distance 547 and second distance 549 may each be about 100 microns.

The first conductive layer 540 may be located entirely between the first location of the first via 544 and the second location of the second via 546 in the X-direction. The first conductive layer 540 may have a width 550 in the X-direction that is less than or equal to a spacing distance 552 in the X-direction between the first location of the first via 544 and the second location of the second via 546. In this embodiment, the width 550 of the first conductive layer 540 is less than the spacing distance 552.

The first and second conductive layers 540, 542 may be capacitively coupled at the overlapping area 543, which may be very small to achieve a very low capacitance. However, the presence of vias within the overlapping area 543 may slightly increase the capacitance of the fourth capacitor 826. Thus, in some embodiments, the overlapping area 543 may be free of vias.

More specifically, in some embodiments, the second conductive layer 542 may be free of via connections within the overlapping area 543 in the X-Y plane. In other words, the second conductive layer 542 may not be connected with vias at locations that intersect the overlapping area 543 in the X-Y plane. Furthermore, in some embodiments each of the first conductive layer 540 and the second conductive layer 542 may be free of via connections that intersect the overlapping area 543 in the X-Y plane.

The arrangement of vias 544, 546 on either side of the overlapping area 543 may prevent a voltage difference from occurring between the location of the first location of the first via 544 and the second location of the second via 546. The first via 544 and second via 556 may both be connected with a ground plane 808, for example as described with reference to FIGS. 8A through 9D. This arrangement may also reduce parasitic inductance associated with the second conductive layer 542.

The second conductive layer 542 may be elongated in the X-direction between a first end portion 554 and a second end portion 556. The first via 544 may be connected with the second conductive layer 542 at the first location, which may be within the first end portion 554. The second via 546 may be connected with the second conductive layer 542 within the second end portion 556. For example, the first end portion 554 may have a length 558 in the X-direction and a width 560 in the Y-direction. The second end portion 556 may have a length 562 in the X-direction and a width 564 in the Y-direction. The lengths 558, 562 of the end portions 554, 556 may be approximately equal.

A middle portion 566 may be connected between the first end portion 554 and the second end portion 556. The middle portion 566 may have a length 568 in the X-direction between the end portions 554, 556. The middle portion 556 may have a width 569 defined at the bounds of the overlapping area 543. The widths 560, 564 of one or both of the end portions 554, 556 may greater than the width 569 of the middle portion 566. For example, the end portions 554, 556 may generally be dimensionally larger than the vias 544, 546 to ensure a quality electrical connection between the vias 544, 546 and the second conductive layer 542. This configuration may permit the width 569 of the middle portion 566 to be smaller than the widths 560, 564 of one or both of the end portions 554, 556. As a result, the overlapping area 543 may smaller than possible if vias were connected with the second conductive layer 542 within the overlapping area 543.

The capacitor 829 may be self-aligning. For example, a size of the overlapping area 543 may be insensitive to a relative misalignment between the first conductive layer 540 and second conductive layer 542. As shown in FIG. 5B, the overlapping area 543 may have a width in the Y-direction equal to the width 569 of the middle portion 566 and a length in the X-direction equal to the width 550 of the first conductive layer 540.

Figure 5C:
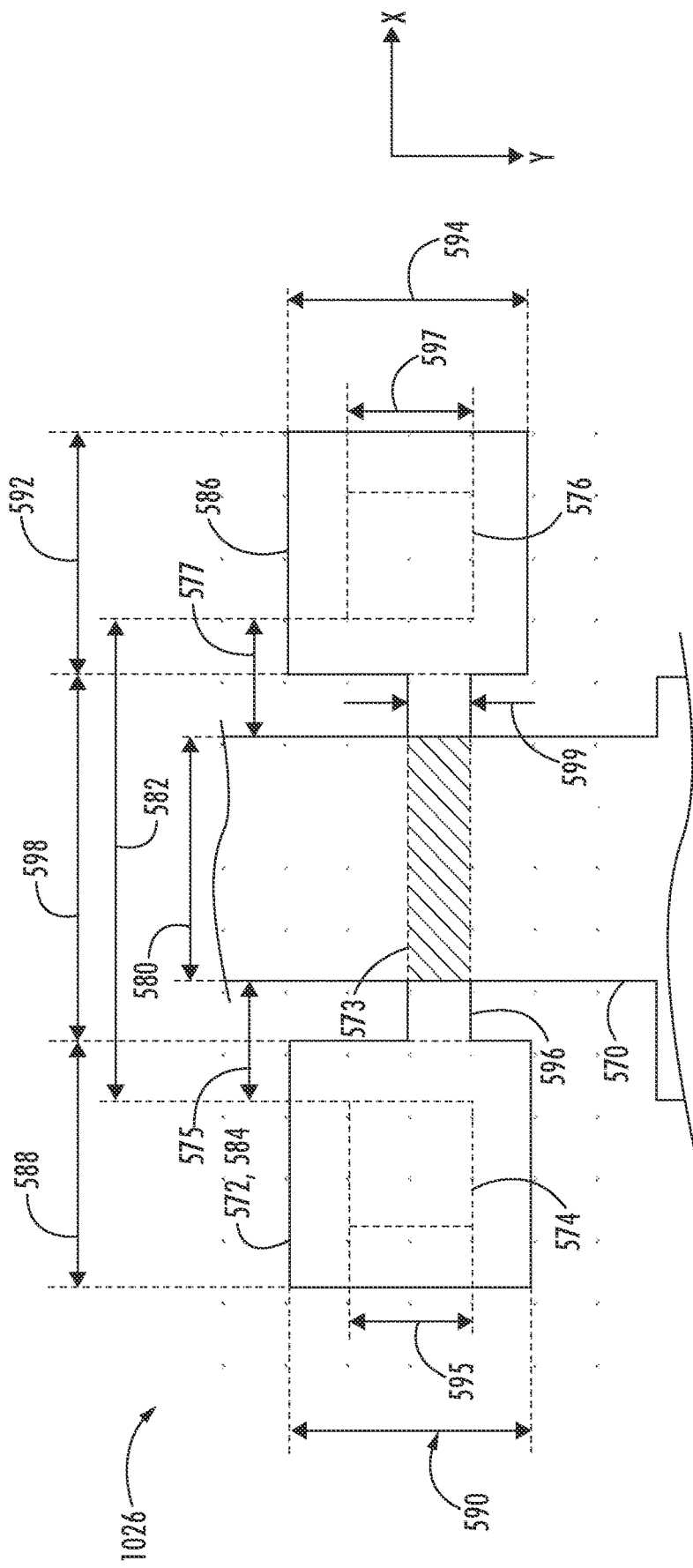
FIGS. 5C and 5D are top down views of the fourth capacitor of the multilayer filter of FIGS. 10A through 10D.

FIG. 5C is a top down view of the fourth capacitor 1026 of a filter 1000 described below with reference to FIGS. 10A through 11D. The filter 1000 may generally be configured similarly to the filter 600 described above with reference to FIGS. 6A through 7D. The fourth capacitor 1026 may include a first conductive layer 570 that is spaced apart in a Z-direction from a second conductive layer 572. The first conductive layer 570 may form part of a signal path 1006 of the filter 1000 as described below with reference to FIGS. 10A through 11D. The first conductive layer 570 may overlap the second conductive layer 572 in the X-Y plane at an overlapping area 573 to form the fourth capacitor 1026. The first conductive layer 570 may be capacitively coupled with the second conductive layer 572 at the overlapping area 573. The first conductive layer 570 is generally free of direct electrical connection with the second conductive layer 572.

A first via 574 may be connected with the second conductive layer 572 at a first location. A second via 576 may be connected with the second conductive layer 572 at a second location. The first location of the first via 574 may be spaced apart from the second location of the second via 576 in the first direction (e.g., the X-direction). The first location of the first location of the first via 574 may be approximately aligned with the second location of the second via 576 in the second direction (e.g., the Y-direction). For example, the first location of the first via 574 may be aligned with the second location of the second via 576 in the second direction (e.g., the Y-direction) by less than about 200 microns.

Figure 5D:
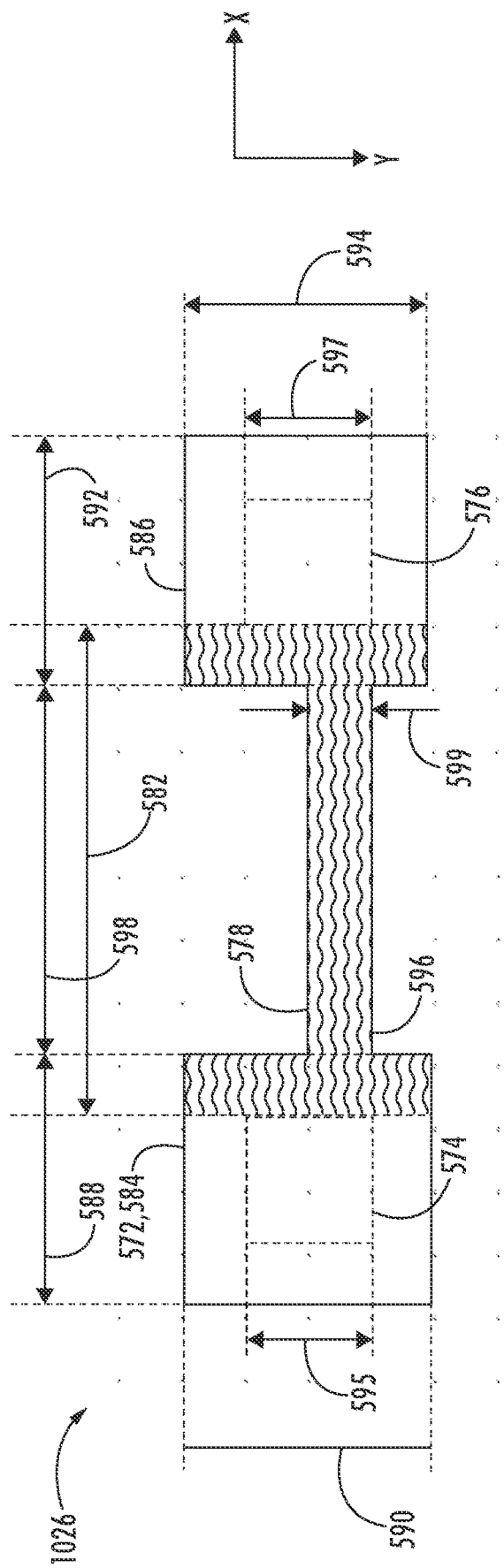

FIG. 5D is a top down view of the fourth capacitor 1026 in which the first conductive layer 570 is omitted for clarity. An intermediary region 578 (represented by hatching having a zig-zag pattern in FIG. 5D) of the second conductive layer 572 may be defined between the first via 574 and the second via 576 in the X-direction. With reference to FIGS. 5C and 5D, at least a portion of the overlapping area 573 may be located between the first location of the first via 574 and the second location of the second via 576 in the X-direction. In other words, the overlapping area 573 may intersect the intermediary region 578. In this example, the overlapping area 573 is located entirely within the intermediary region 578.

The overlapping area 573 may be spaced apart from the first location 574 by a first distance 575 in the X-direction. The overlapping area 573 may be spaced apart from the second location 576 by a second distance 577 in the X-direction. One or both of the first distance 575 and second distance 577 may be greater than about 10 microns. In this example, the first distance 575 and second distance 577 may each be about 100 microns.

The first conductive layer 570 may be located entirely between the first location of the first via 574 and the second location of the second via 576 in the X-direction. The first conductive layer 570 may have a width 580 in the X-direction that is less than a spacing distance 582 in the X-direction between the first location of the first via 574 and the second location of the second via 576.

The first and second conductive layers 570, 572 may be capacitively coupled at the overlapping area 573. The overlapping area 573 may be small to achieve a low capacitance. However, the presence of vias within the overlapping area 573 may slightly increase the capacitance of the fourth capacitor 1026. Thus, in some embodiments, the overlapping area 573 may be free of vias.

More specifically, in some embodiments, the second conductive layer 572 may be free of via connections within the overlapping area 573 in the X-Y plane. In other words, the second conductive layer 572 may not be connected with vias at locations that intersect the overlapping area 573 in the X-Y plane. Furthermore, in some embodiments each of the first conductive layer 570 and the second conductive layer 572 may be free of via connections that intersect the overlapping area 573 in the X-Y plane.

The arrangement of vias 574, 576 on either side of the overlapping area 573 may prevent a voltage difference from occurring between the location of the first location of the first via 574 and the second location of the second via 576. The first via 574 and second via 576 may both be connected with a ground plane 1008, for example as described with reference to FIGS. 10A through 11D. This arrangement may also reduce parasitic inductance associated with the second conductive layer 572.

The second conductive layer 572 may be elongated in the X-direction between a first end portion 584 and a second end portion 586. The first via 574 may be connected with the second conductive layer 572 at the first location, which may be within the first end portion 584. The second via 576 may be connected with the second conductive layer 572 within the second end portion 586. For example, the first end portion 584 may have a length 588 in the X-direction and a width 590 in the Y-direction. The second end portion 586 may have a length 592 in the X-direction and a width 594 in the Y-direction. The lengths 588, 592 of the end portions 584, 586 may be approximately equal.

A middle portion 596 may be connected between the first end portion 584 and the second end portion 586. The middle portion 596 may have a length 598 in the X-direction between the end portions 584, 586. The middle portion 596 may have a width 599 defined at bounds of the overlapping area 573. The widths 590, 594 of one or both of the end portions 584, 586 may greater than the width 599 of the middle portion 596. For example, the end portions 584, 586 may generally be dimensionally larger than the vias 574, 576 to ensure a quality electrical connection between the vias 574, 576 and the second conductive layer 572. This configuration may permit the width 599 of the middle portion 596 to be smaller than the widths 560, 564 of one or both of the end portions 554, 556. As a result, the overlapping area 573 may smaller than possible if vias were connected with the second conductive layer 572 within the overlapping area 573. More specifically, the vias 574, 576 may have respective widths 595, 597 in the Y-direction. The width 595, 597 of the vias 574, 576 may be greater than the width 599 of the middle portion 596.

The capacitor 1026 may be self-aligning. For example, a size of the overlapping area 573 may be insensitive to a relative misalignment between the first conductive layer 570 and second conductive layer 572. As shown in FIG. 5G, the overlapping area 573 may have a width in the Y-direction equal to the width 599 of the middle portion 596 and a length in the X-direction equal to the width 580 of the first conductive layer 570.

III. Additional Example Embodiments

Figure 6A:
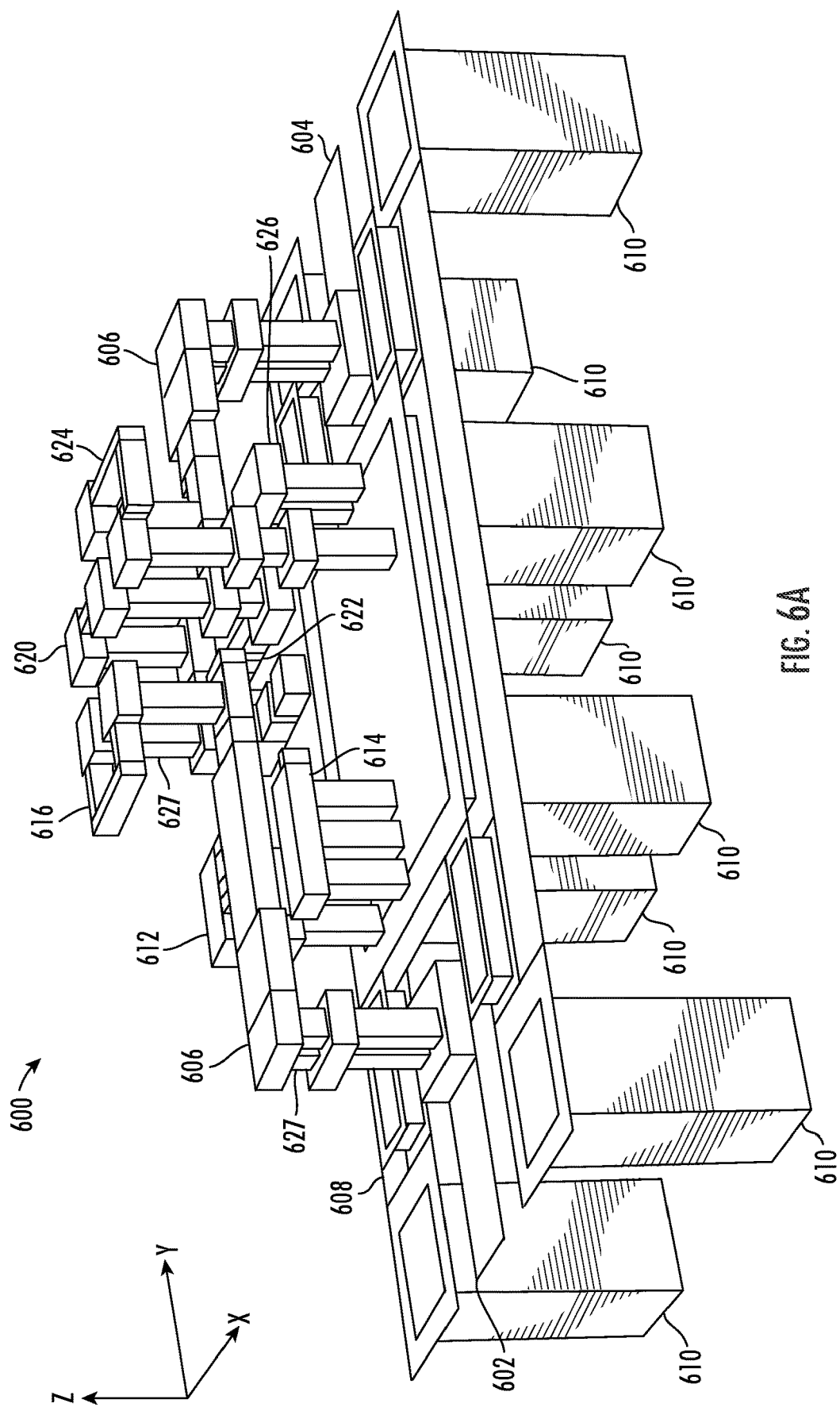
FIGS. 6A and 6B are perspective views of another embodiment of a multilayer filter according to aspects of the present disclosure.
Figure 6B:
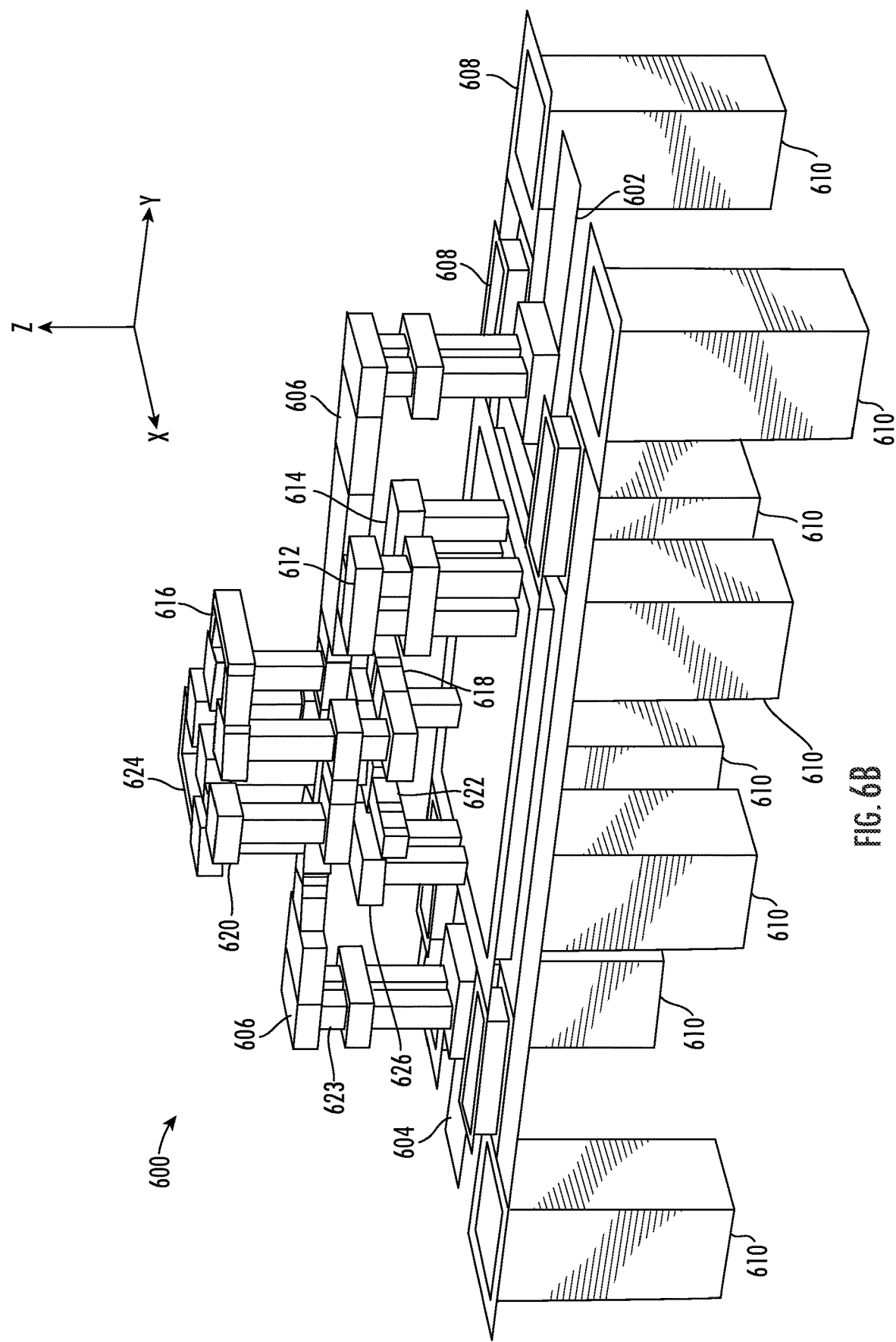

FIG. 6A illustrates a perspective view of another embodiment of a multilayer filter 600 according to aspects of the present disclosure. FIG. 6B illustrates another perspective view of the multilayer filter 600 of FIG. 6A. The filter 600 may generally be configured in a similar manner as the filter 300 described above with reference to FIGS. 3 through 5D. The filter 600 may include an input 602, an output 604, and a signal path 606 connecting the input 602 and the output 604. The filter 600 may also include a ground plane 608 electrically connected with one or more ground electrodes 610.

The filter 600 may include a first inductor 612 that is electrically connected with the ground plane 608. The first inductor 612 may correspond with the first inductor 208 of the circuit diagram 200 described above with reference to FIG. 2. The filter 600 may include a first capacitor 614 electrically coupled with the ground plane 608. The first capacitor 614 may correspond with the first capacitor 210 of the circuit diagram 200 described above with reference to FIG. 2.

The filter 600 may include a second inductor 616 and a second capacitor 618 that are connected in parallel with each other. The second inductor 616 and second capacitor 618 may correspond with the second inductor 212 and second capacitor 214, respectively, of the circuit diagram 200 described above with reference to FIG. 2. The second inductor 616 and second capacitor 618 may form a portion of the signal path 606 between the input 602 and the output

604. The filter 600 may include a third inductor 620 and third capacitor 622 that are connected in parallel with each other and may form a portion of the signal path 606 between the input 602 and the output 604. The third inductor 620 and third capacitor 622 may correspond with the third inductor 216 and third capacitor 218, respectively, of the circuit diagram 200 described above with reference to FIG. 2. Lastly, the filter 600 may include a fourth inductor 624 and fourth capacitor 626 that are connected in parallel with each other and connected between the signal path 606 and the ground plane 608. The fourth inductor 624 and fourth capacitor 626 may correspond with the fourth inductor 220 and the fourth capacitor 222, respectively, of the circuit diagram 200 described above with reference to FIG. 2.

The inductors 612, 616, 620, 624 and capacitors 614, 618, 622, 626 may be connected by vias 627 in a similar manner as described above with reference to FIGS. 3 through 5D. Each of the inductors 612, 616, 620, 624 may be connected with the signal path 606 at a respective first location and connected with the signal path 606 or the ground plane 608 at a respective second location. Each of the inductors 612, 616, 620, 624 may have a respective effective length (e.g., in the X-Y plane) between the first location and the second location. Additionally, each of the inductors 612, 616, 620, 624 may have a respective width along its respective effective length.

Figure 6C:
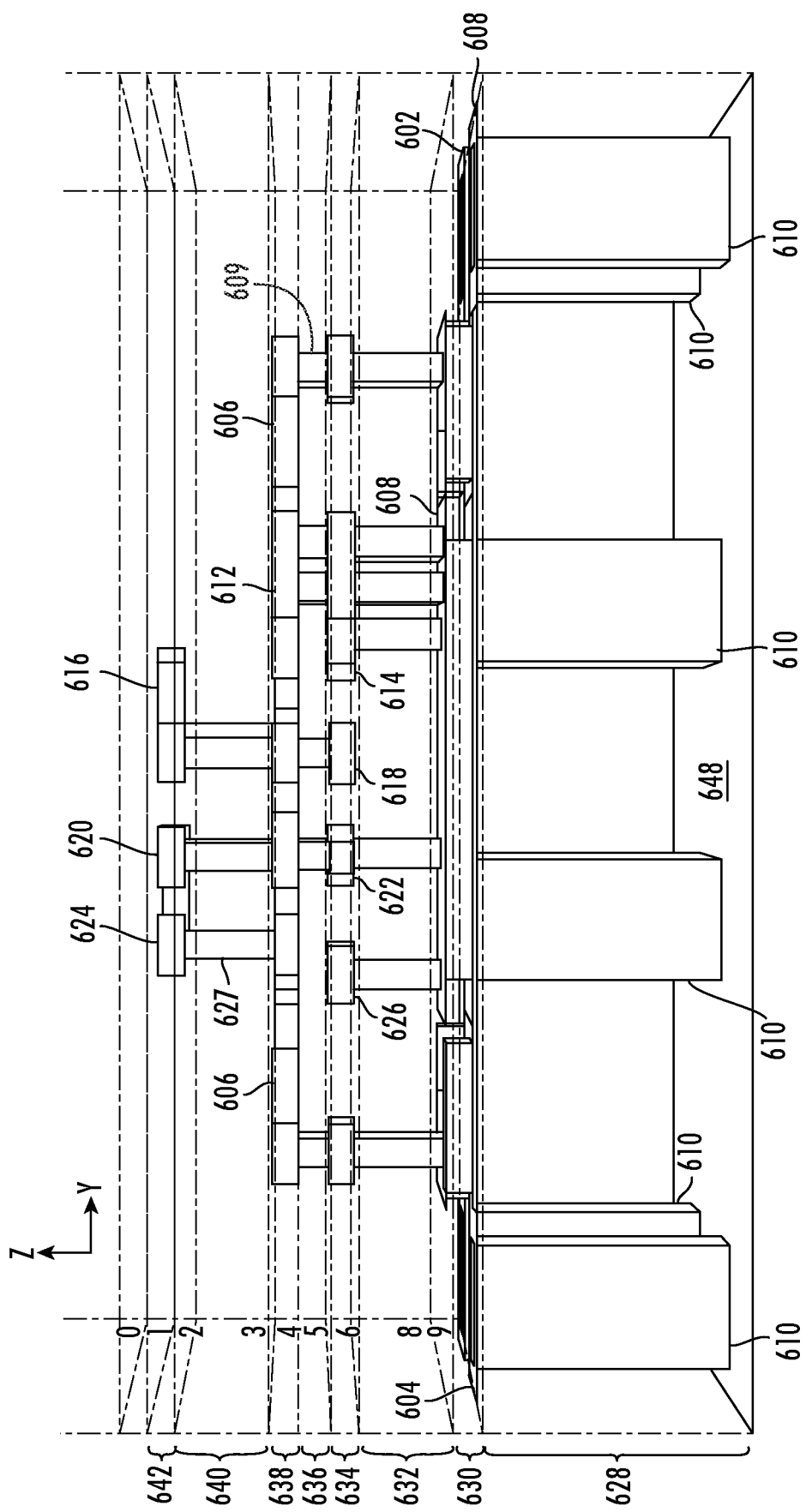
FIG. 6C is a side elevation view of the filter of FIGS. 6A and 6B.

FIG. 6C is a side elevation view of the filter 600 of FIGS. 6A and 6B. The band pass filter 600 may include a plurality of dielectric layers (transparent for clarity in FIGS. 6A and 6B). Referring to FIG. 6C, a first layer 632, a second layer 636, and a third layer 640 may be stacked to form a monolithic structure. Conductive layers 630, 634, 638, 642 may be formed on the dielectric layers 632, 636, 640. Conductive layer 630 may be formed on a bottom surface of the first dielectric layer 632. Conductive layers 634, 638 may be formed on a top surface and a bottom surface, respectively of the second dielectric layer 636. Conductive layer 642 may be formed on a top surface of the third dielectric layer 640.

Figure 7B:
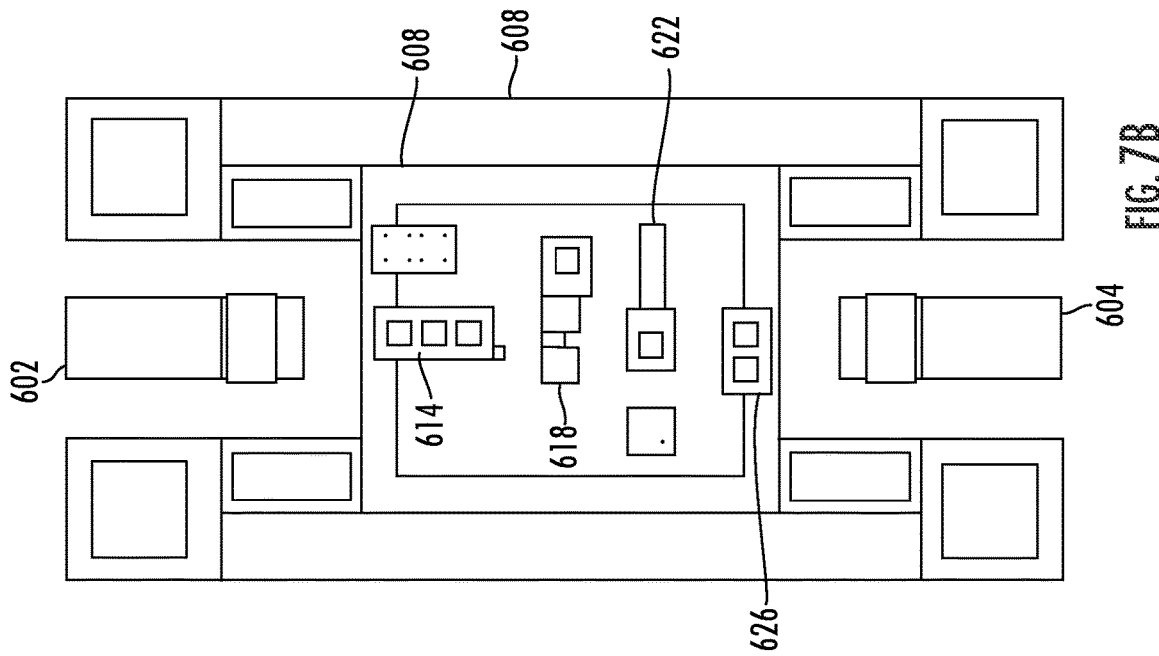
Figure 7A:
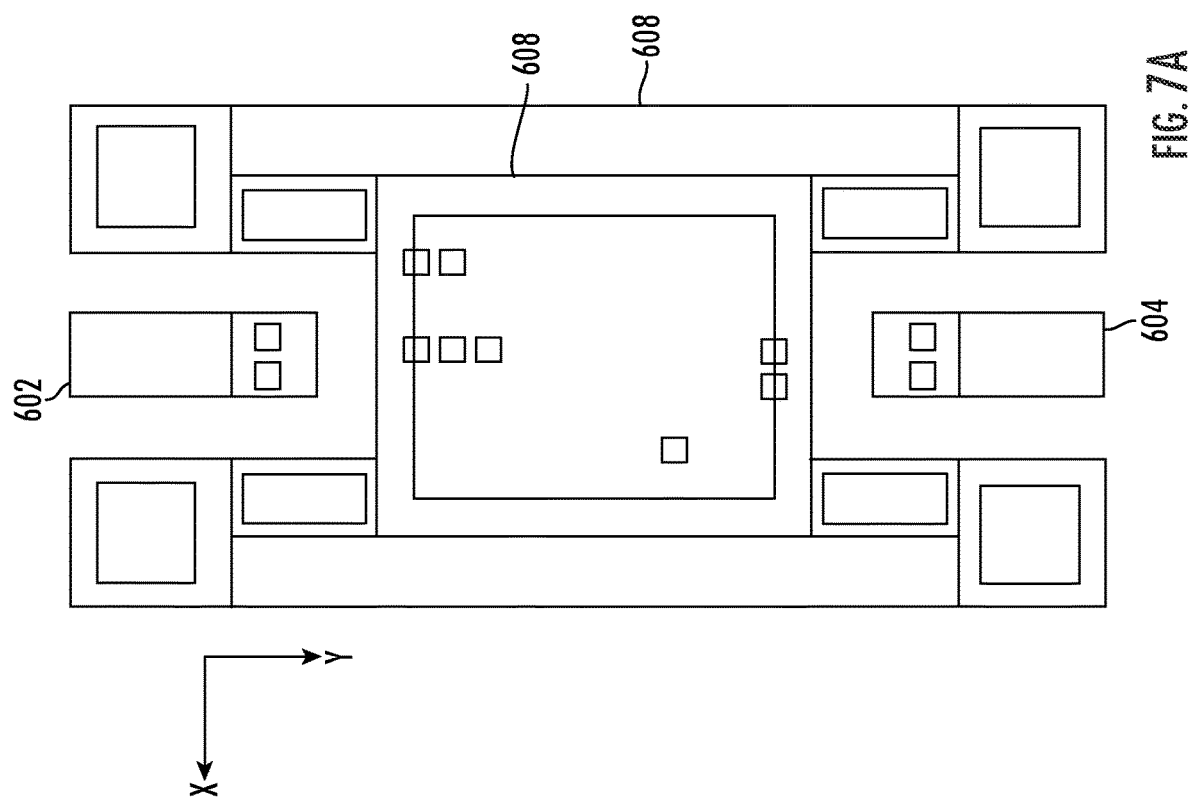

FIGS. 7A through 7D are a series of sequential top down views of the filter 600 of FIGS. 6A through 6C in which an additional dielectric layer is shown in each Figure. More specifically, FIG. 7A illustrates a mounting surface 628, such a printed circuit board. The first conductive layers 630 may include the ground plane 608, which may be formed on a bottom surface and a top surface of the first layer 632. FIG. 7B additionally illustrates the second conductive layer 634 formed on the first dielectric layer 632. The second conductive layer 634 may include the first capacitor 614, second capacitor 618, third capacitor 622 and forth capacitor 626. FIG. 7C additionally illustrates the third conductive layer 638 that is formed on the second dielectric layer 636. The third conductive layer 638 may include portions of the signal path 606 and the first inductor 612. FIG. 7D illustrates the fourth conductive layer 642 formed on the fourth dielectric layer 640. The fourth conductive layer 642 may include the second inductor 616, third inductor 622, and fourth inductor 624. The dielectric layers 632, 636, 640 are transparent to show the relative relocations of the various patterned conductive layers 630, 634, 638, 642.

Figure 8A:
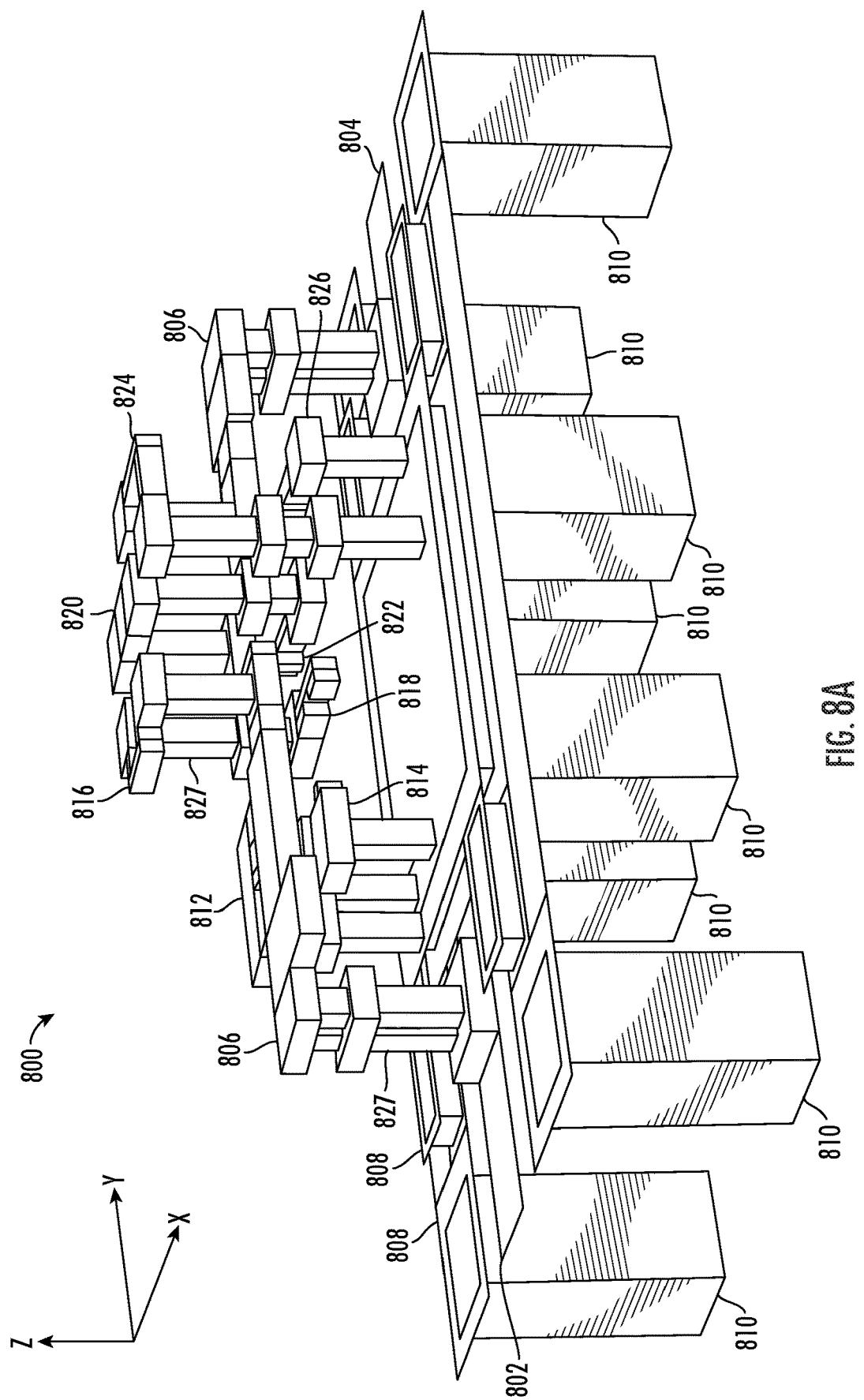
FIG. 8A is a perspective view of another embodiment of a multilayer filter according to aspects of the present disclosure.

FIG. 8A illustrates a perspective view of another embodiment of a multilayer filter 800 according to aspects of the present disclosure. The filter 800 may generally be configured in a similar manner as the filter 300 described above with reference to FIGS. 3 through 5D. The filter 800 may include an input 802, an output 804, and a signal path 806 connecting the input 802 and the output 804. The filter 800 may also include a ground plane 808 electrically connected with one or more ground electrodes 810.

The filter 800 may include a first inductor 812 that is electrically connected with the ground plane 808. The first inductor 812 may correspond with the first inductor 208 of the circuit diagram 200 described above with reference to FIG. 2. The filter 800 may include a first capacitor 814 electrically coupled with the ground plane 808. The first capacitor 814 may correspond with the first inductor capacitor 210 of the circuit diagram 200 described above with reference to FIG. 2. The filter 800 may include a second inductor 816 and second capacitor 818 that are connected in parallel with each other. The second inductor 816 and second capacitor 818 may correspond with the second inductor 212 and second capacitor 214, respectively, of the circuit diagram 200 described above with reference to FIG. 2. The second inductor 816 and second capacitor 818 may form a portion of the signal path 806 between the input 802 and the output 804. The filter 800 may include a third inductor 820 and third capacitor 822 that are connected in parallel with each other and may form a portion of the signal path 806 between the input 802 and the output 804. The third inductor 820 and third capacitor 822 may correspond with the third inductor 216 and third capacitor 218, respectively, of the circuit diagram 200 described above with reference to FIG. 2. Lastly, the filter 800 may include a fourth inductor 824 and fourth capacitor 826 that are connected in parallel with each other and connected between the signal path 806 and the ground plane 808. The fourth inductor 824 and fourth capacitor 826 may correspond with the fourth inductor 220 and the fourth capacitor 222, respectively, of the circuit diagram 200 described above with reference to FIG. 2.

The inductors 812, 816, 820, 824 and capacitors 814, 818, 822, 826 may be connected by vias 827 in a similar manner as described above with reference to FIGS. 3 through 5D. Each of the inductors 812, 818, 820, 824 may be connected with the signal path 806 at a respective first location and connected with the signal path 806 or the ground plane 808 at a respective second location. Each of the inductors 812, 818, 820, 824 may have a respective effective length (e.g., in the X-Y plane) between the first location and the second location. Additionally, each of the inductors 812, 818, 820, 824 may have a respective width along its respective effective length.

Figure 8B:
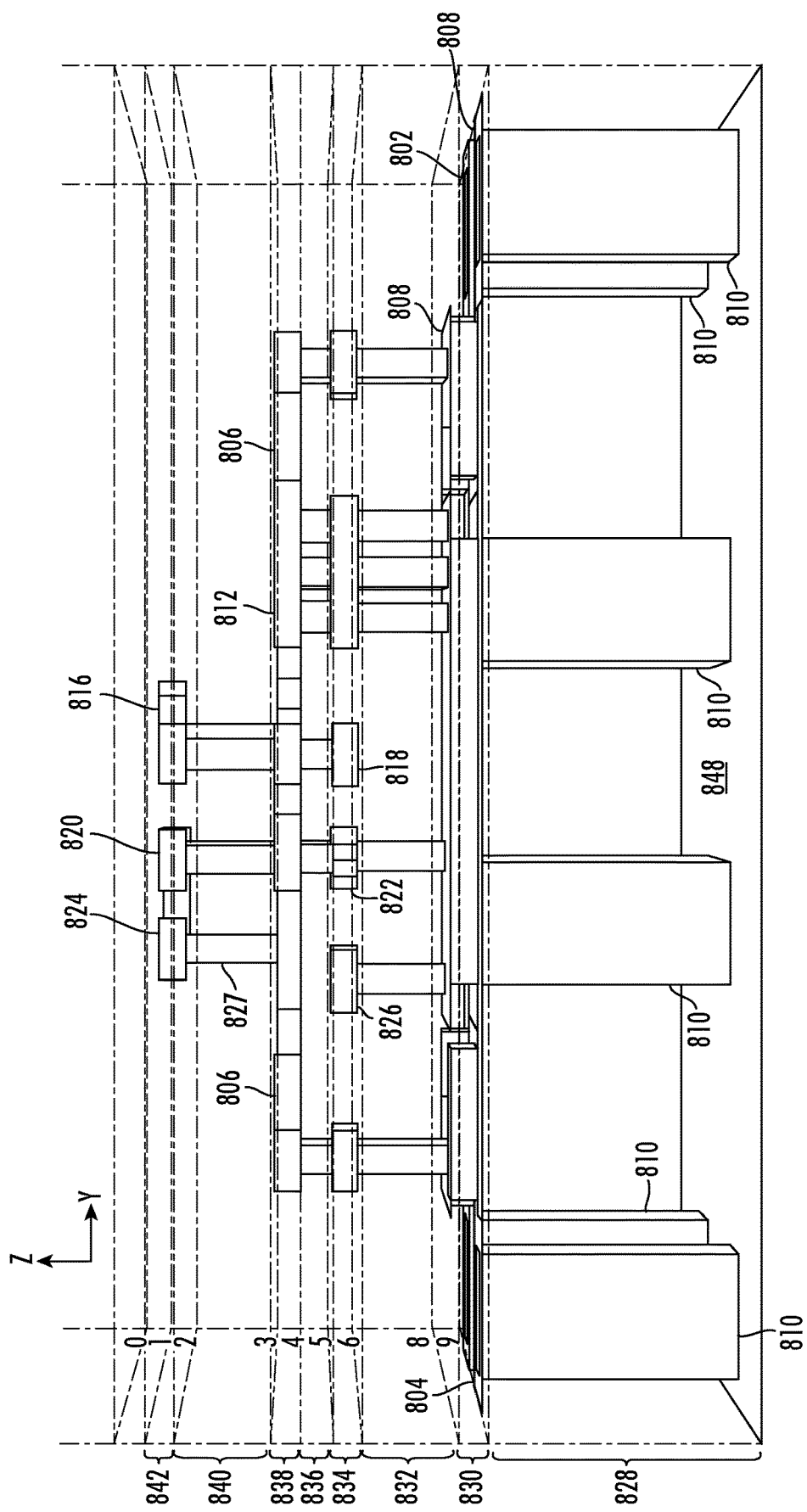
FIG. 8B is a side elevation view of the filter of FIG. 8A.

FIG. 8B is a side elevation view of the filter 800 of FIG. 8A. The band pass filter 800 may include a plurality of dielectric layers (transparent for clarity in FIG. 8A). Referring to FIG. 8B, a first layer 832, a second layer 836, and a third layer 840 may be stacked to form a monolithic structure. Conductive layers 830, 834, 838, 842 may be formed on the dielectric layers 832, 836, 840. Conductive layer 830 may be formed on a bottom surface of the first dielectric layer 832. Conductive layers 834, 838 may be formed on a top surface and a bottom surface, respectively of the second dielectric layer 836. Conductive layer 842 may be formed on a top surface of the third dielectric layer 840.

Figure 9B:
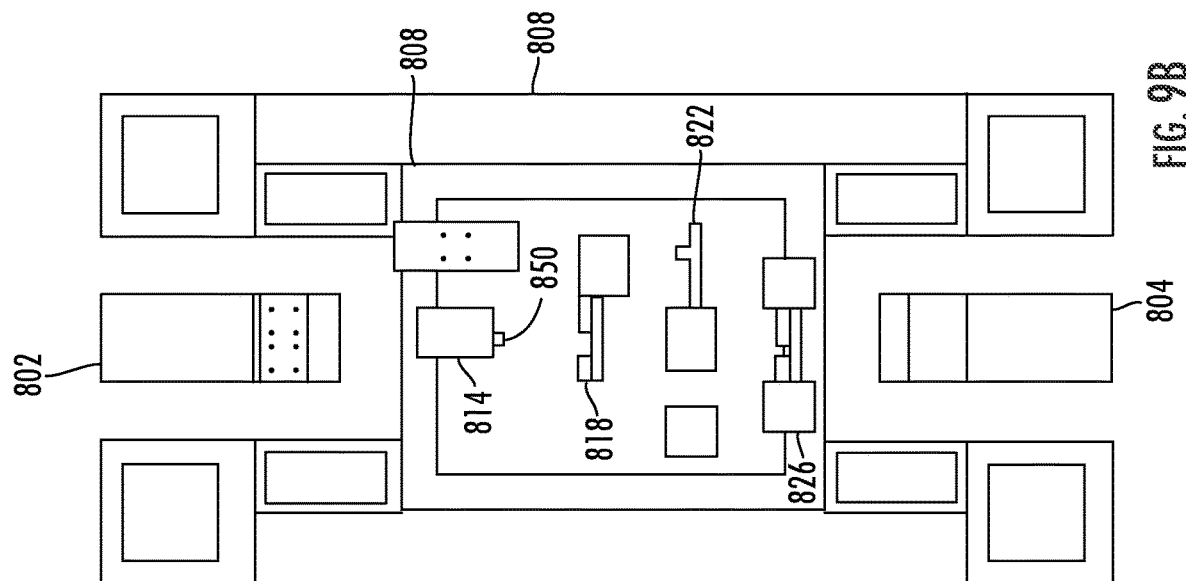
Figure 9A:
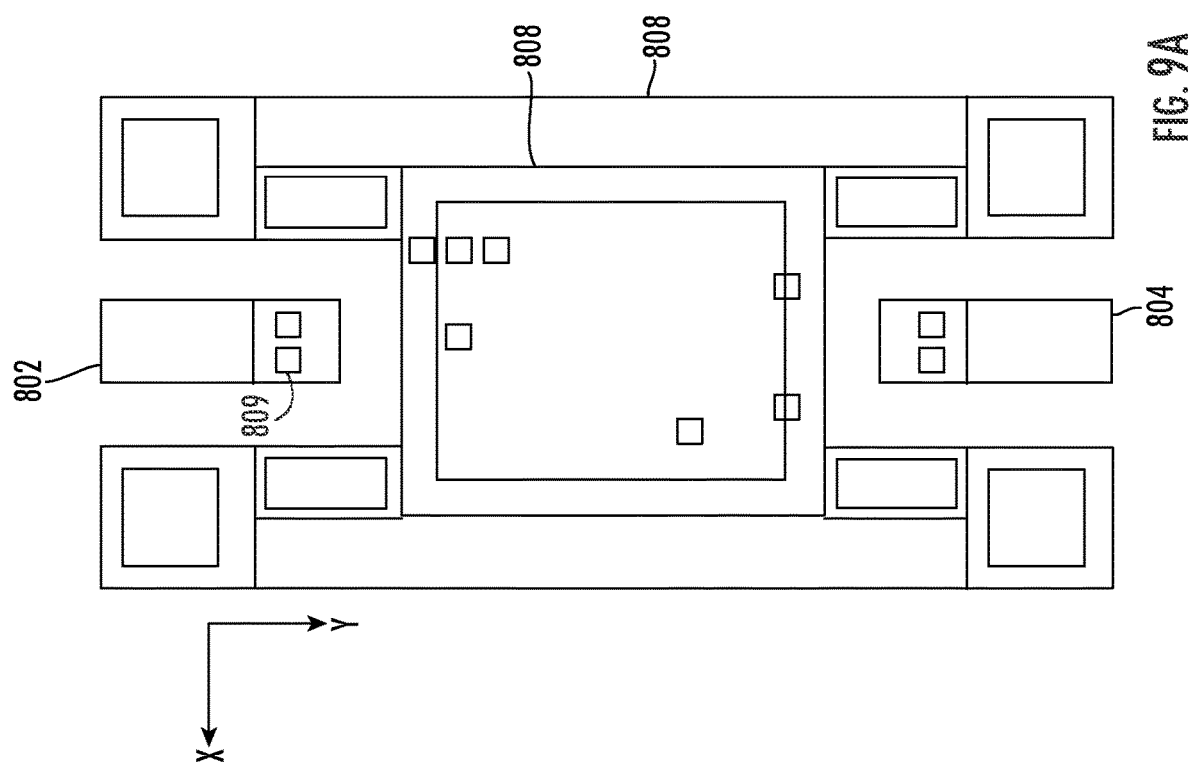

FIGS. 9A through 9D are a series of sequential top down views of the filter 600 of FIGS. 8A and 8B in which an additional dielectric layer is shown in each Figure. More specifically, FIG. 9A illustrates a mounting surface 828, such as a printed circuit board. The first conductive layers 830 may include the ground plane 808, which may be formed on a bottom surface and a top surface of the first layer 832. FIG. 9B additionally illustrates the second conductive layer 834 formed on the first dielectric layer 832. The second conductive layer 834 may include the first capacitor 814, second capacitor 818, third capacitor 822 and forth capacitor 826. FIG. 9C additionally illustrates the third conductive layer 838 that is formed on the second dielectric layer 836. The third conductive layer 838 may include portions of the signal path 806 and the first inductor 812. FIG. 9D illustrates the fourth conductive layer 842 formed on the fourth dielectric layer 840. The fourth conductive layer 842 may include the second inductor 816, third inductor 822, and fourth inductor 824. The dielectric layers 832, 836, 840 are transparent to show the relative relocations of the various patterned conductive layers 830, 834, 838, 842.

Figure 10A:
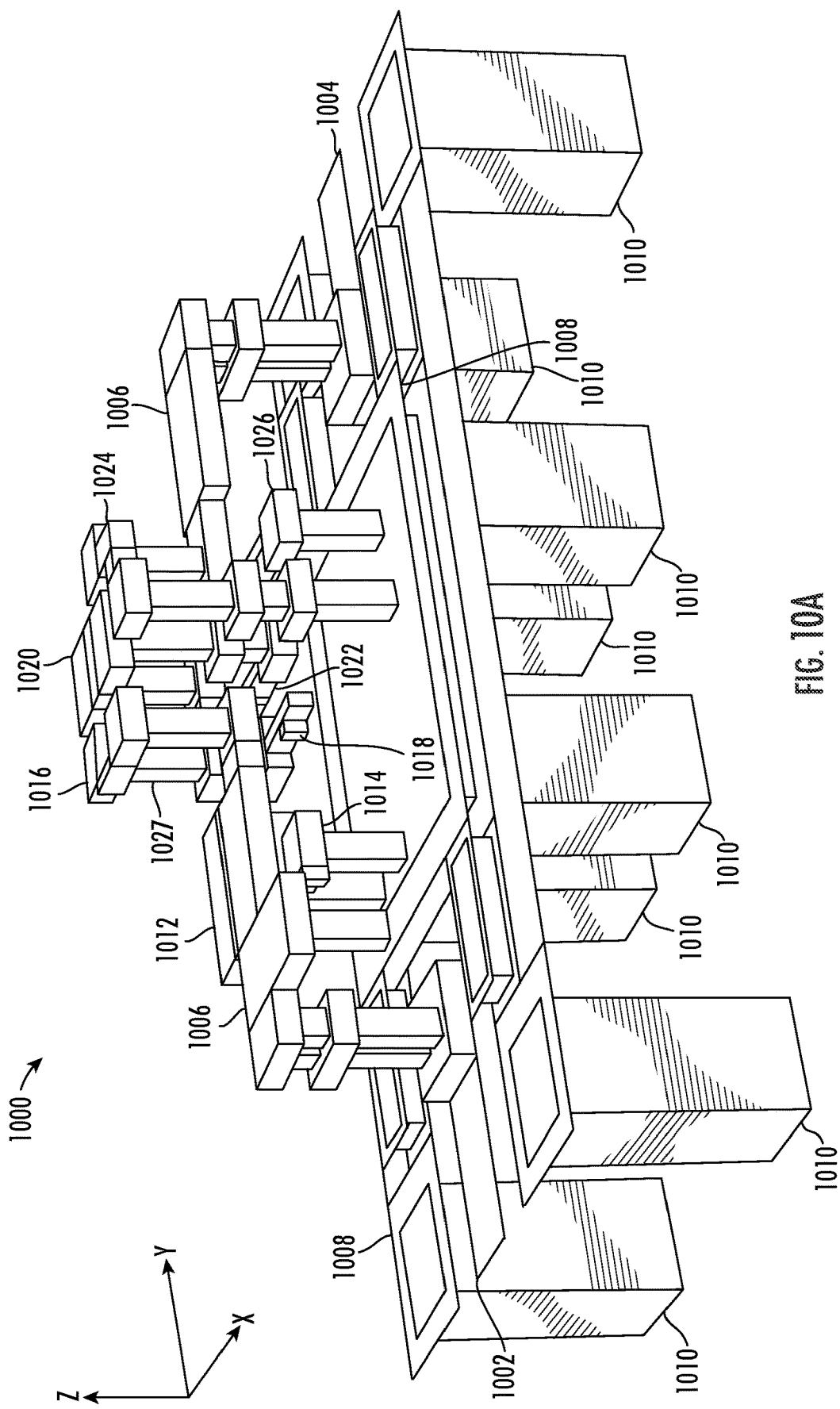
FIG. 10A is a perspective view of another embodiment of a multilayer filter according to aspects of the present disclosure.
Figure 10B:
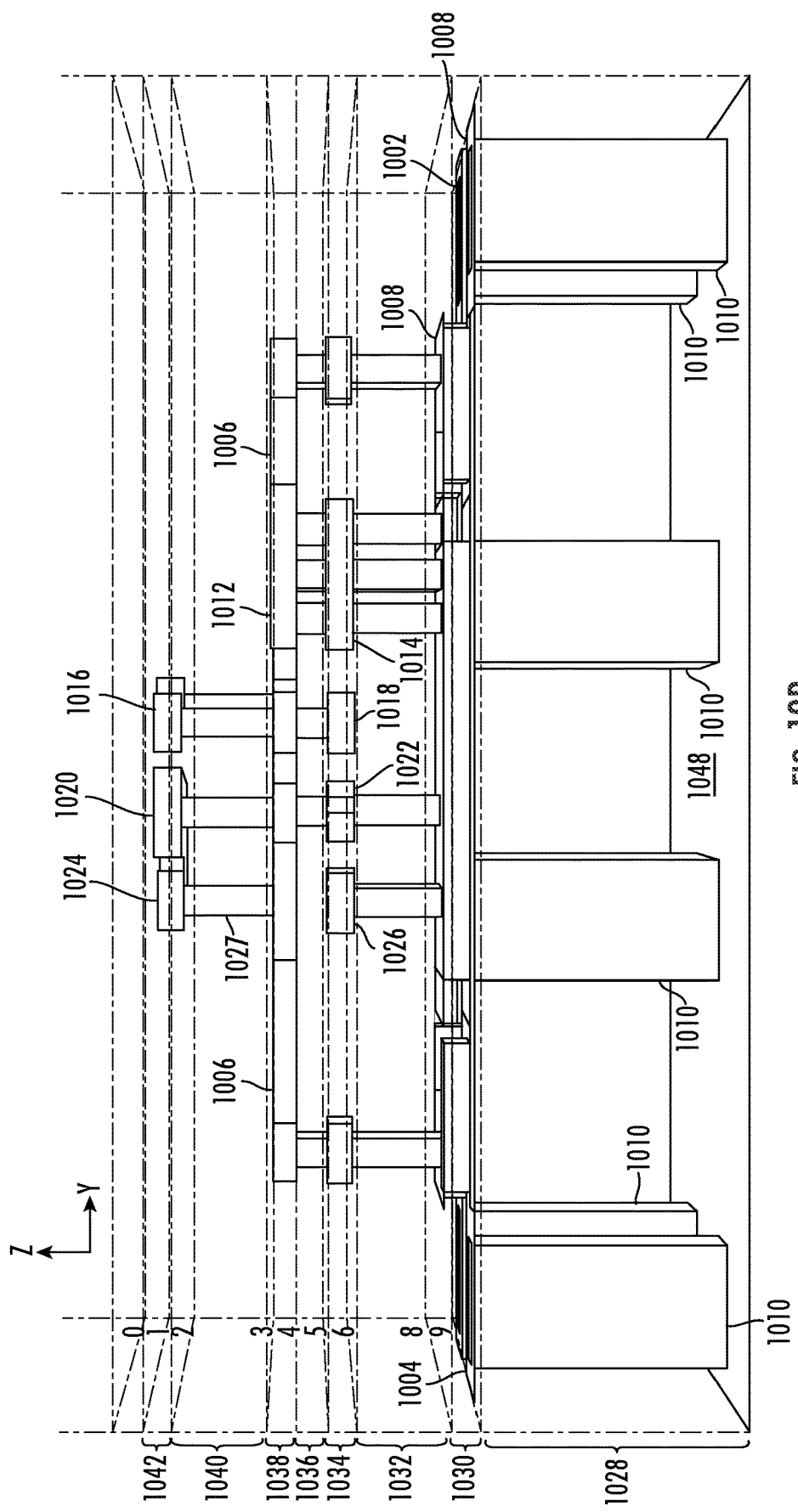
FIG. 10B is a side elevation view of the filter of FIG. 10A.

FIG. 10A illustrates a perspective view of another embodiment of a multilayer filter 1000 according to aspects of the present disclosure. FIG. 10B illustrates another perspective view of the multilayer filter 1000 of FIG. 10A. The filter 1000 may generally be configured in a similar manner as the filter 300 described above with reference to FIGS. 3 through 5D. The filter 1000 may include an input 1002, an output 1004, and a signal path 1006 connecting the input 1002 and the output 1004. The filter 1000 may also include a ground plane 1008 electrically connected with one or more ground electrodes 1010.

The filter 1000 may include a first inductor 1012 that is electrically connected with the ground plane 1008. The first inductor 1012 may correspond with the first inductor 208 of the circuit diagram 200 described above with reference to FIG. 2. The filter 1000 may include a first capacitor 1014 electrically coupled with the ground plane 1008. The first capacitor 1014 may correspond with the first inductor capacitor 210 of the circuit diagram 200 described above with reference to FIG. 2. The filter 1000 may include a second inductor 1016 and second capacitor 1018 that are connected in parallel with each other. The second inductor 1016 and second capacitor 1018 may correspond with the second inductor 212 and second capacitor 214, respectively, of the circuit diagram 200 described above with reference to FIG. 2. The second inductor 1016 and second capacitor 1018 may form a portion of the signal path 1006 between the input 1002 and the output 1004. The filter 1000 may include a third inductor 1020 and third capacitor 1022 that are connected in parallel with each other and may form a portion of the signal path 1006 between the input 1002 and the output 1004. The third inductor 1020 and third capacitor 1022 may correspond with the third inductor 216 and third capacitor 218, respectively, of the circuit diagram 200 described above with reference to FIG. 2. Lastly, the filter 1000 may include a fourth inductor 1024 and fourth capacitor 1026 that are connected in parallel with each other and connected between the signal path 1006 and the ground plane 1008. The fourth inductor 1024 and fourth capacitor 1026 may correspond with the fourth inductor 220 and the fourth capacitor 222, respectively, of the circuit diagram 200 described above with reference to FIG. 2.

The inductors 1012, 1016, 1020, 1024 and capacitors 1014, 1018, 1022, 1026 may be connected by vias 1027 in a similar manner as described above with reference to FIGS. 3 through 5D. Each of the inductors 1012, 10110, 1020, 1024 may be connected with the signal path 1006 at a respective first location and connected with the signal path 1006 or the ground plane 1008 at a respective second location. Each of the inductors 1012, 10110, 1020, 1024 may have a respective effective length (e.g., in the X-Y plane) between the first location and the second location. Additionally, each of the inductors 1012, 10110, 1020, 1024 may have a respective width along its respective effective length.

FIG. 10B is a side elevation view of the filter 1000 of FIGS. 10A and 10B. The band pass filter 1000 may include a plurality of dielectric layers (transparent for clarity in FIG. 10A). Referring to FIG. 10B, a first layer 1032, a second layer 1036, a third layer 1040 may be stacked to form a monolithic structure. Conductive layers 1030, 1034, 1038, 1042 may be formed on the dielectric layers 1032, 1036, 1040. Conductive layer 1030 may be formed on a bottom surface of the first dielectric layer 1032. Conductive layers 1034, 1038 may be formed on a top surface and a bottom surface, respectively of the second dielectric layer 1036. Conductive layer 1042 may be formed on a top surface of the third dielectric layer 1040.

FIGS. 11A through 11D are a series of sequential top down views of the filter 600 of FIGS. 10A and 10B in which an additional dielectric layer is shown in each Figure. More specifically, FIG. 11A illustrates a mounting surface 1028, such a printed circuit board. The first conductive layer 1030 may include the ground plane 1008, which may be formed on a bottom surface and a top surface of the first layer 1030. FIG. 11B additionally illustrates the second conductive layer 1034 formed on the first dielectric layer 1032. The second conductive layer 1034 may include the first capacitor 1014, second capacitor 1018, third capacitor 1022 and forth capacitor 1026. FIG. 11C additionally illustrates the third conductive layer 1038 that is formed on the second dielectric layer 1036. The third conductive layer 1038 may include portions of the signal path 1006 and the first inductor 1012. FIG. 11D illustrates the fourth conductive layer 1042 formed on the fourth dielectric layer 1040. The fourth conductive layer 1042 may include the second inductor 1016, third inductor 1022, and fourth inductor 1024. The dielectric layers 1032, 1036, 1040 are transparent to show the relative relocations of the various patterned conductive layers 1030, 1034, 1038, 1042.

IV. Applications

The various embodiments of the filter described herein may find application in any suitable type of electrical component. The filter may find particular application in devices that receive, transmit, or otherwise employ high frequency radio signals. Example applications include smartphones, signal repeaters (e.g., small cells), relay stations, and radar.

Examples

Computer modeling was used to simulate multilayer high frequency filters according to aspects of the present disclosure. Additionally, filters were built and tested. It should be understood that the following dimensions are merely given as examples and do not limit the scope of the present disclosure.

Various multilayer filters (including the multilayer filters 300, 600, 800, 1000 described above) may be configured to have the following pass band frequency ranging and the following respective capacitive areas, in square millimeters (mm$^2$):

TABLE 1

Example Capacitive Areas

| Embodiment | Approximate Pass Band (GHz) | First Capacitor | Second Capacitor | Third Capacitor | Fourth Capacitor |
|---|---|---|---|---|---|
| — | 12-15 | 0.253 | 0.085 | 0.036 | 0.077 |
| — | 16-18 | 0.173 | 0.059 | 0.028 | 0.065 |
| Filter 300 | 17-21 | 0.153 | 0.058 | 0.028 | 0.063 |
| Filter 600 | 24.5-28 | 0.083 | 0.038 | 0.020 | 0.038 |
| Filter 800 | 34.5-37.5 | 0.065 | 0.015 | 0.013 | 0.018 |
| Filter 1000 | 43-46.5 | 0.044 | 0.013 | 0.010 | 0.010 |

As shown in the above table, the fourth capacitors of the filters 300, 600, 800, 1000, which are described in detail above with reference to FIGS. 5A through 5H, may have very small capacitive areas (e.g., less than about 0.08 mm$^2$).

The thicknesses of the dielectric layers may generally be less than about 180 micrometers ("microns"). For instance, in some embodiments, the first layers 304, 632, 832, 1032 may be about 60 microns thick. The second layers 306, 636, 836, 1036 may be about 20 microns thick. The third layers 308, 640, 840, 1040 may be about 60 microns thick.

In some embodiments, the overall length of the filters may be 4.3 mm. The overall width may be about 4 mm. The overall thickness may be about 230 microns.

Figure 12:
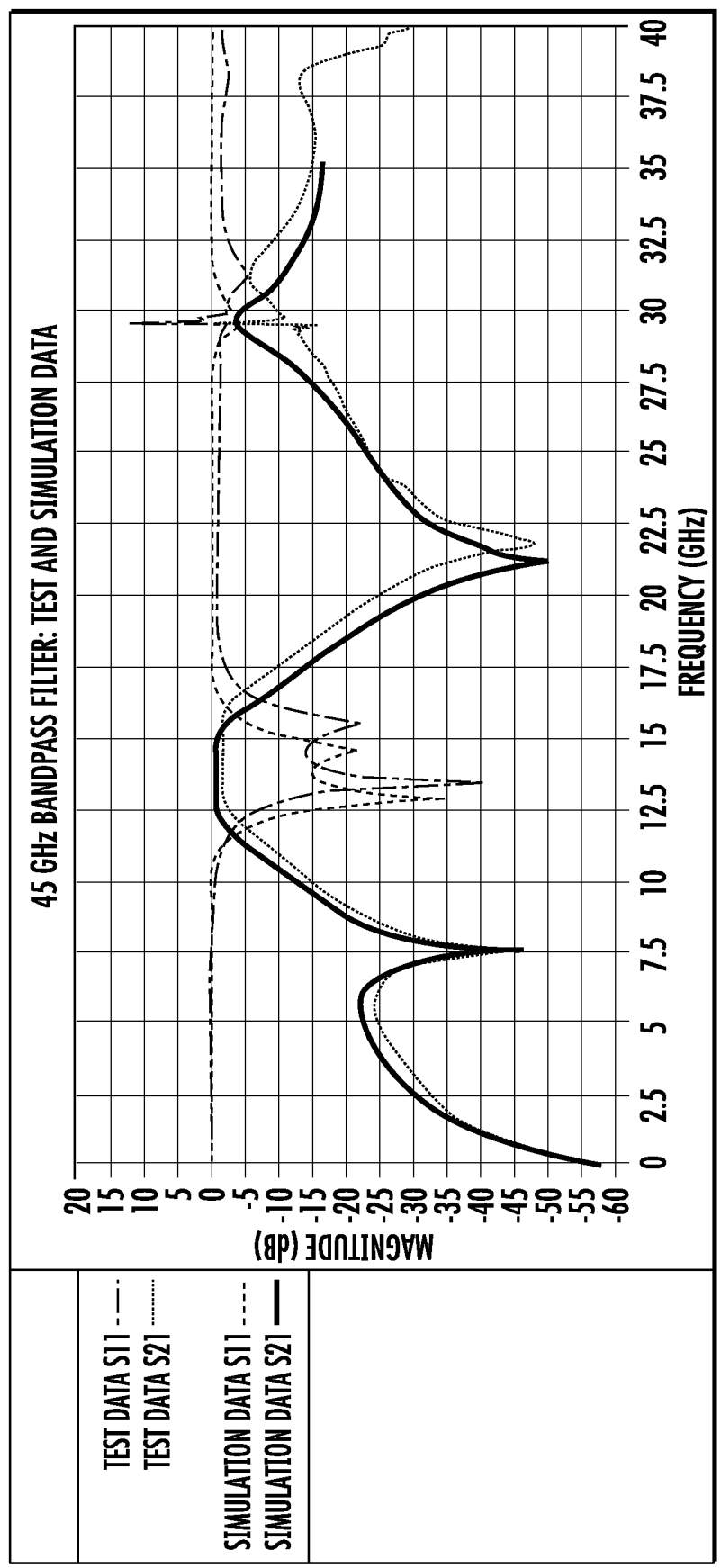
FIG. 12 is a plot of test data including measured insertion loss and return loss values for a filter constructed according to aspects of the present disclosure.

FIGS. 12-17 present test results and simulation data for the various filters. Referring to FIG. 12, a multilayer filter according to aspects of the present disclosure was built and tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The measured pass band is from about 13.2 GHz to about 15.8 GHz.

Figure 13:
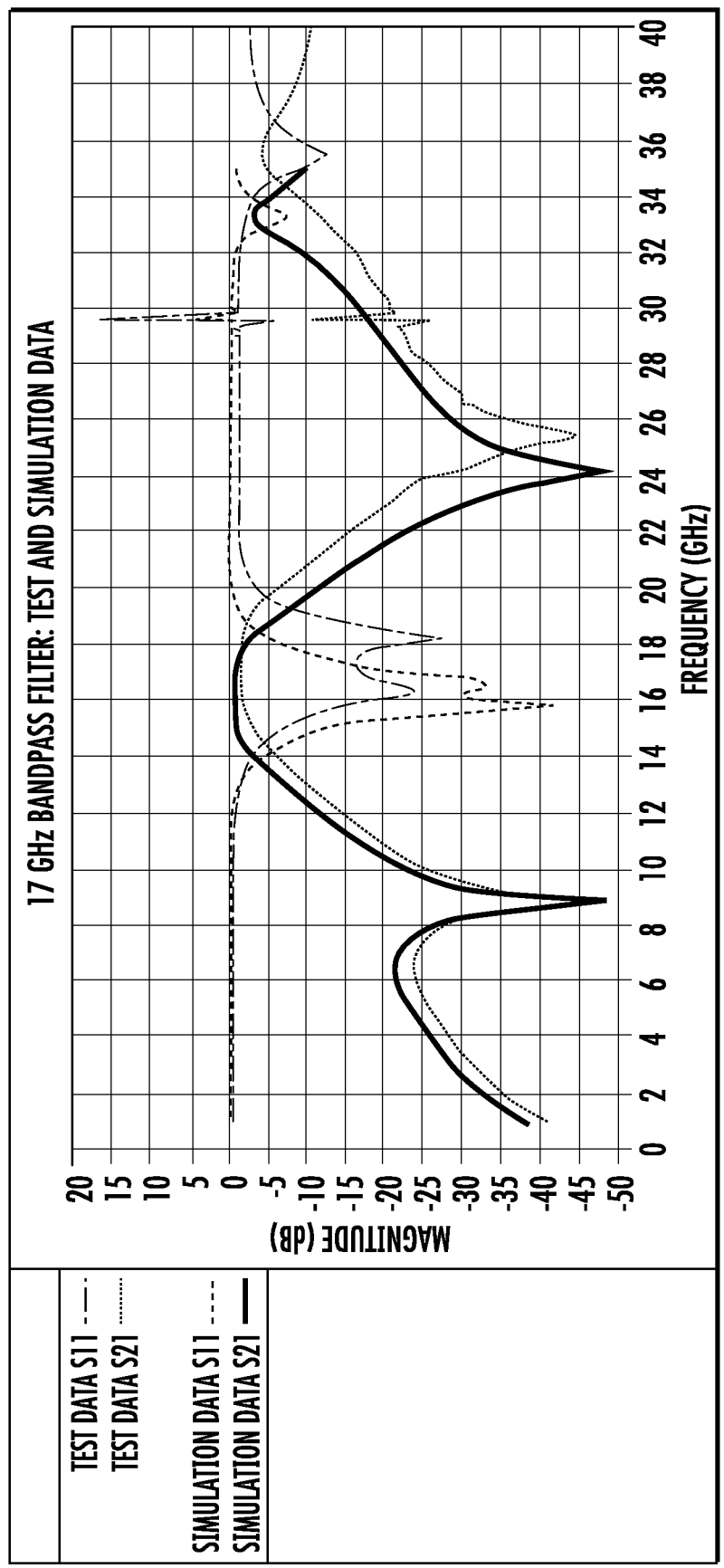
FIG. 13 is a plot of test data including measured insertion loss and return loss values for a filter constructed according to aspects of the present disclosure.

Referring to FIG. 13, a multilayer filter according to aspects of the present disclosure was built and tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The pass band is from about 16.1 GHz to about 18.2 GHz.

Figure 14:
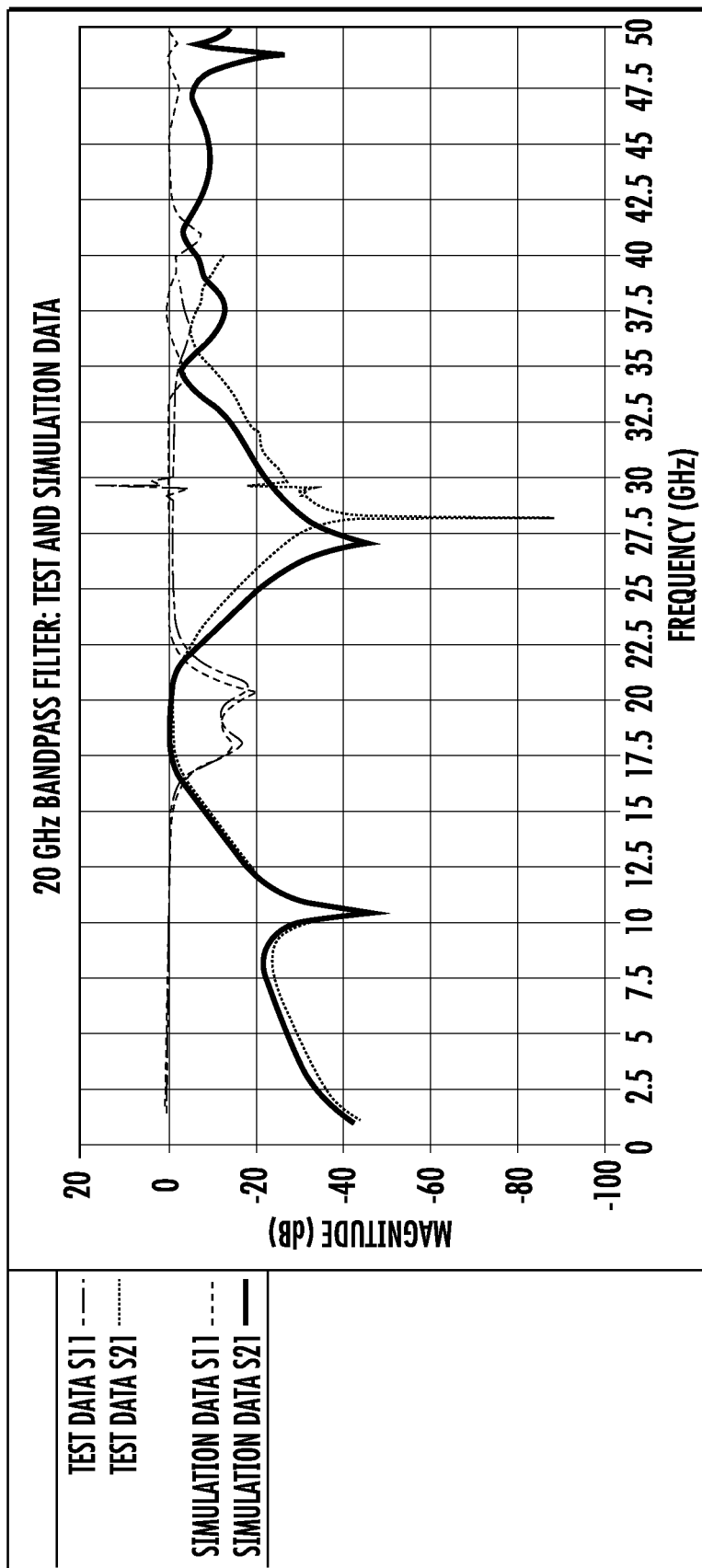
FIG. 14 is a plot of test data including measured insertion loss and return loss values for a filter constructed according to aspects of the present disclosure.
Figure 5:
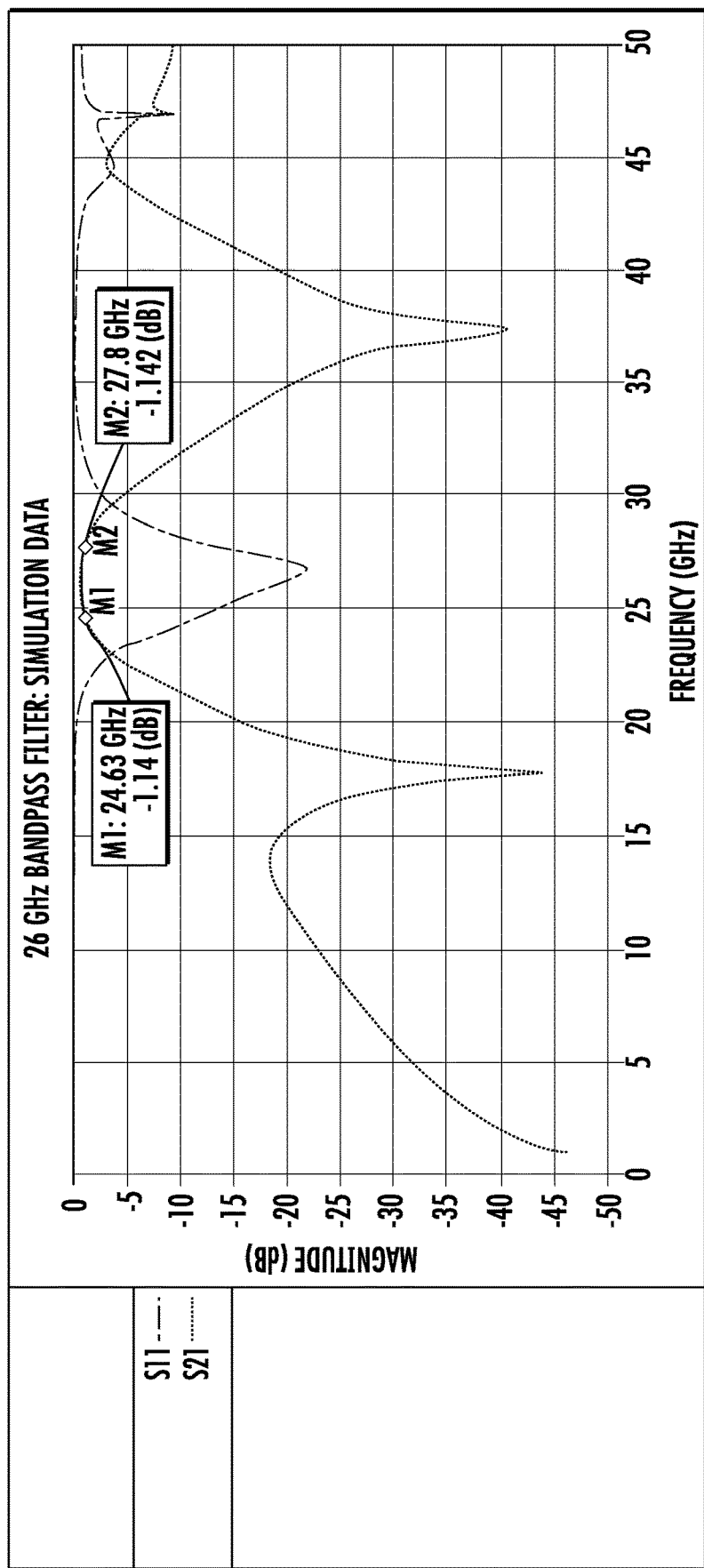

Referring to FIG. 14, the multilayer filter 300 described above with reference to FIGS. 3A through 4E was both simulated and built and physically tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The pass band is from about 17.0 GHz to about 21.2 GHz.

Referring to FIG. 15, the multilayer filter 600 described above with reference to FIGS. 6A through 7D was simulated. Simulated insertion loss ($S_{21}$) values and simulated return loss ($S_{11}$) values are plotted from 0 GHz to 50 GHz. The pass band is from about 24.6 GHz to about 27.8 GHz.

Figure 16:
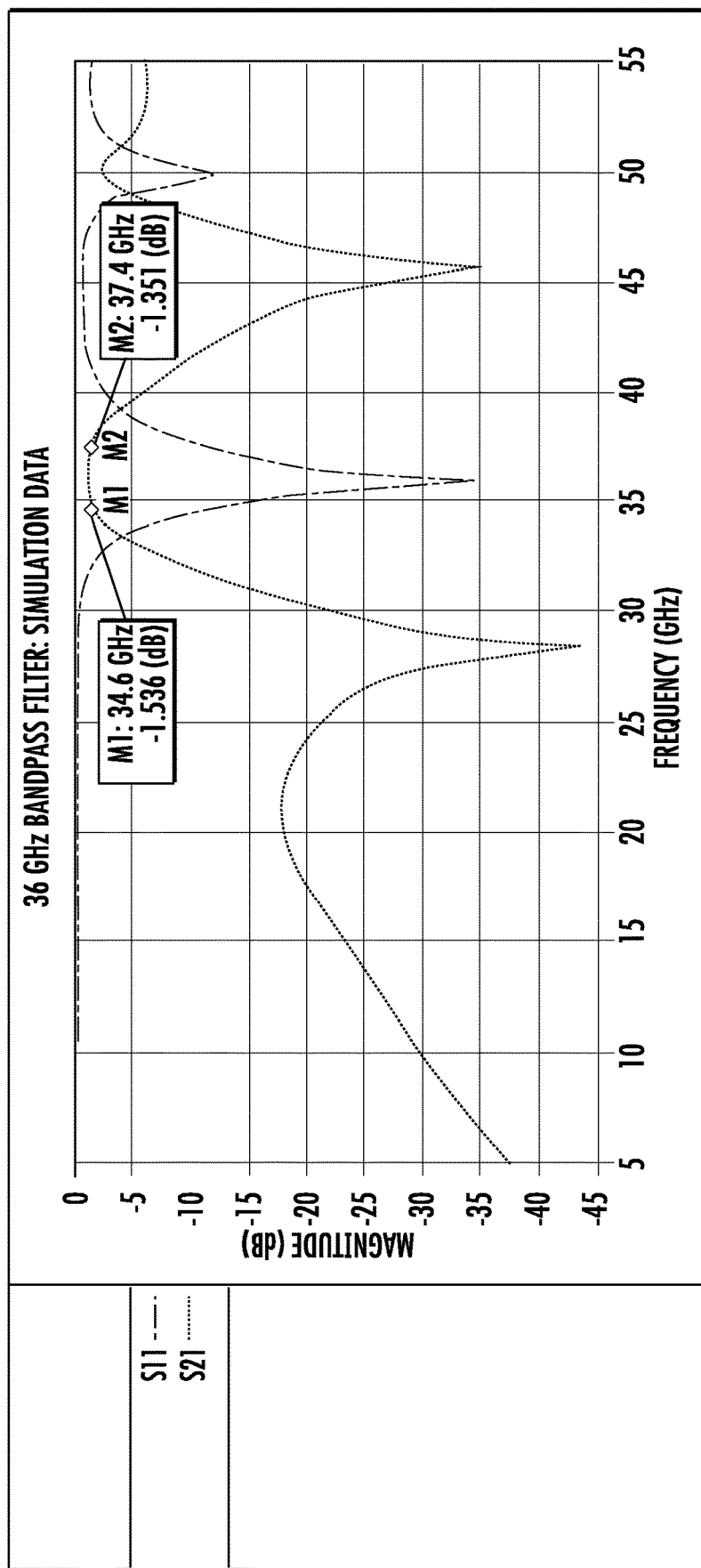
FIG. 16 is a plot of simulation data including insertion loss and return loss values from a computer analysis of a filter according to aspects of the present disclosure.

Referring to FIG. 16, the multilayer filter 800 described above with reference to FIGS. 8A through 9D was simulated. Simulated insertion loss ($S_{21}$) values and simulated return loss ($S_{11}$) values are plotted from 0 GHz to 55 GHz. The pass band is from about 34.6 GHz to about 37.4 GHz.

Figure 17:
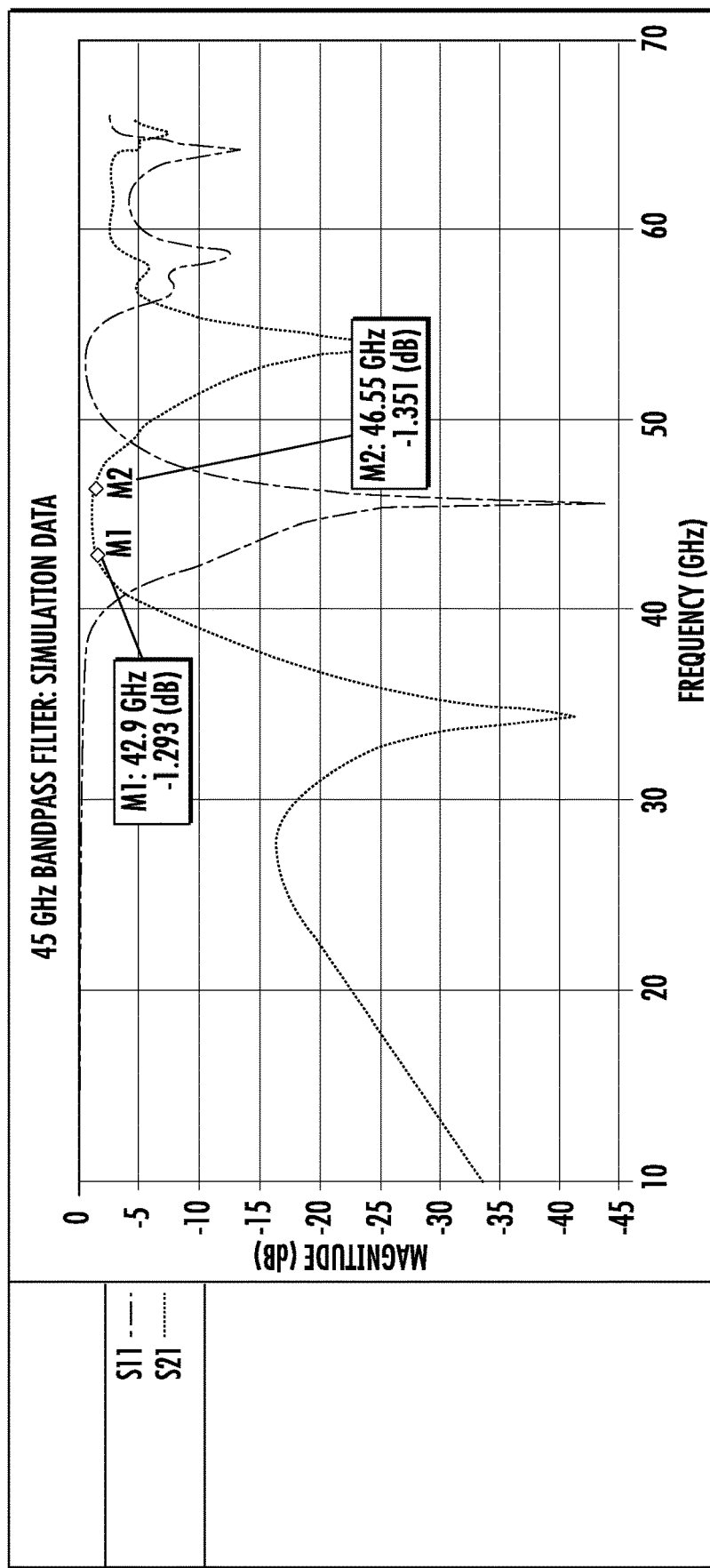
FIG. 17 is a plot of simulation data including insertion loss and return loss values from a computer analysis of a filter according to aspects of the present disclosure.

Referring to FIG. 17, the multilayer filter 1000 described above with reference to FIGS. 10A through 11D was simulated. Simulated insertion loss ($S_{21}$) values and simulated return loss ($S_{11}$) values are plotted from 0 GHz to 70 GHz. The pass band is from about 42.9 GHz to about 46.6 GHz.

Test Methods

Referring to FIG. 18, a testing assembly 1800 can be used to test performance characteristics, such as insertion loss and return loss, of a multilayer filter 1802 according to aspects of the present disclosure. The filter 1802 can be mounted to a test board 1804. An input line 1806 and an output line 1808 were each connected with the test board 1804. The test board 1804 may include microstrip lines 1810 electrically connecting the input line 1806 with an input of the filter 1802 and electrically connecting the output line 1808 with an output of the filter 1802. An input signal was applied to the input line using a source signal generator (e.g., an 1806 Keithley 2400 series Source Measure Unit (SMU), for example, a Keithley 2410-C SMU) and the resulting output of the filter 1802 was measured at the output line 1808 (e.g., using the source signal generator). This was repeated for various configurations of the filter.

These and other modifications and variations of the present disclosure may be practiced by those of ordinary skill in the art, without departing from the spirit and scope of the present disclosure. In addition, it should be understood that aspects of the various embodiments may be interchanged both in whole and in part. Furthermore, those of ordinary skill in the art will appreciate that the foregoing description is by way of example only, and is not intended to limit the disclosure so further described in such appended claims.

What is claimed is:

1. A multilayer filter comprising:
   a plurality of dielectric layers stacked in a Z-direction such that respective surfaces of the plurality of dielectric layers are perpendicular to the Z-direction, wherein the Z-direction is perpendicular to each of an X-direction and a Y-direction, the X direction perpendicular to the Y direction;
   a first conductive layer overlying one of the plurality of dielectric layers;
   a second conductive layer overlying another of the plurality of dielectric layers and spaced apart from the first conductive layer in the Z-direction;
   a first via connected with the second conductive layer at a first location; and
   a second via connected with the second conductive layer at a second location that is spaced apart in the X direction from the first location;
   wherein the first conductive layer overlaps the second conductive layer in each of the X direction and the Y direction at an overlapping area to form a capacitor, and wherein the second conductive layer is free of via connections that intersect the overlapping area in each of the X direction and Y direction.

2. The multilayer filter of claim 1, wherein the first conductive layer is free of via connections that intersect the overlapping area in each of the X direction and Y-direction.

3. The multilayer filter of claim 1, wherein the overlapping area is located entirely between the first location and the second location in the X direction.

4. The multilayer filter of claim 1, wherein the overlapping area is spaced apart from each of the first location and second location in the X direction by at least about 10 microns.

5. The multilayer filter of claim 4, wherein the first location and second location are spaced apart by a spacing distance in the X direction, and the first conductive layer has a width in the X direction at the overlapping area that is less than or equal to the spacing distance.

6. The multilayer filter of claim 1, wherein the second conductive layer is elongated in the first direction between a first end portion and a second end portion, the first location located within the first end portion, and the second location located within the second end portion.

7. The multilayer filter of claim 6, wherein the second conductive layer has a middle portion connected between the first end portion and the second end portion, at least a portion of the middle portion is located within the overlapping area.

8. The multilayer filter of claim 7, wherein at least one of the first end portion or the second end portion has a width in the Y direction that is greater than a width of the middle portion in the Y direction at the overlapping area.

9. The multilayer filter of claim 1, wherein the first via and second via have respective widths in the Y direction, and wherein the second conductive layer has a width in the Y direction at an edge of the overlapping area that is less than the width of at least one of the first or second vias.

10. The multilayer device of claim 1, wherein the first location is approximately aligned with the second location in the Y direction.

11. The multilayer device of claim 1, wherein overlapping area is less than about 0.5 mm$^2$.

12. The multilayer filter of claim 1, wherein the capacitor is self-aligning.

13. The multilayer filter of claim 1, wherein a size of the overlapping area is insensitive to a relative misalignment between the first conductive layer and the second conductive layer.

14. The multilayer filter of claim 1, wherein the multilayer filter has a characteristic frequency that is greater than about 6 GHz.

15. The multilayer filter of claim 1, wherein the characteristic frequency comprises at least one of a low pass frequency, a high pass frequency, or an upper bound of a bandpass frequency.

16. The multilayer filter of claim 1, wherein the second conductive layer and the first conductive layer are spaced apart in the Z-direction by less than about 500 microns.

17. The multilayer filter of claim 1, further comprising a ground plane and a via electrically connecting at least one of the first conductive layer or the second conductive layer to the ground plane.

18. The multilayer filter of claim 1, comprising a dielectric material disposed between the first conductive layer and the second conductive layer, the dielectric material having a dielectric constant that ranges from about 5 to about 8 in accordance with IPC TM-650 2.5.5.3 at an operating temperature of 25° C. and frequency of 1 MHz.

19. The multilayer filter as in claim 18, further comprising an additional dielectric material having a dielectric constant that ranges from about 1 to about 4 in accordance with IPC TM-650 2.5.5.3 at an operating temperature of 25° C. and frequency of 1 MHz.

20. The multilayer filter of claim 1, further comprising a dielectric material having a dielectric constant that is less than about 100 as determined in accordance with IPC TM-650 2.5.5.3 at an operating temperature of 25° C. and frequency of 1 MHz.

21. The multilayer filter of claim 1, further comprising a dielectric material having a dielectric constant that is greater than about 100 as determined in accordance with IPC TM-650 2.5.5.3 at an operating temperature of 25° C. and frequency of 1 MHz.

22. The multilayer filter of claim 1, further comprising a dielectric material that comprises an epoxy.

23. The multilayer filter of claim 1, further comprising an organic dielectric material.

24. The multilayer filter of claim 1, wherein the organic dielectric material comprises at least one of liquid crystalline polymer or polyphenyl ether.

25. A method of forming a frequency multilayer filter, the method comprising:
  providing a plurality of dielectric layers;
  forming a first conductive layer overlying one of the plurality of dielectric layers;
  forming a second conductive layer overlying another of the plurality of dielectric layers and spaced apart from the first conductive layer in the Z-direction;
  forming a first via connected with the second conductive layer at a first location and a second via connected with the second conductive layer at a second location that is spaced apart in the X direction from the first location; and
  stacking the plurality of dielectric layers such that the first conductive layer overlaps the second conductive layer in each of the X direction and Y direction at an overlapping area to form a capacitor, and wherein at least a portion of the overlapping area is located between the first location and the second location in the X-direction, and wherein the second conductive layer is free of via connections that intersect the overlapping area in each of the X direction and Y direction.

* * * * *